United States Patent
Venkatesan

(10) Patent No.: US 10,530,125 B1
(45) Date of Patent: Jan. 7, 2020

(54) VERTICAL CAVITY SURFACE EMITTING LASER

(71) Applicant: POET Technologies, Inc., San Jose, CA (US)

(72) Inventor: Suresh Venkatesan, Los Gatos, CA (US)

(73) Assignee: POET Technologies, Inc., San Jose, CA (US)

( * ) Notice: Subject to any disclaimer, the term of this patent is extended or adjusted under 35 U.S.C. 154(b) by 0 days.

(21) Appl. No.: 16/206,673

(22) Filed: Nov. 30, 2018

(51) Int. Cl.
*H01S 5/125* (2006.01)
*H01S 5/42* (2006.01)
*H01S 5/183* (2006.01)
*G09G 3/3208* (2016.01)

(52) U.S. Cl.
CPC .......... *H01S 5/125* (2013.01); *G09G 3/3208* (2013.01); *H01S 5/18327* (2013.01); *H01S 5/423* (2013.01)

(58) Field of Classification Search
CPC .................................................. H01S 5/06256
USPC ........................................ 372/50.11; 257/98
See application file for complete search history.

(56) References Cited

U.S. PATENT DOCUMENTS

| | | | |
|---|---|---|---|
| 6,849,869 B1 * | 2/2005 | O'Regan | H01L 51/5265 257/40 |
| 7,039,075 B2 | 5/2006 | Thornton | |
| 7,471,706 B2 | 12/2008 | Bass et al. | |
| 8,680,507 B1 * | 3/2014 | Arkun | H01L 33/10 257/13 |
| 2002/0167981 A1 | 11/2002 | Eisenbeiser | |
| 2006/0291769 A1 | 12/2006 | Spoonhower et al. | |
| 2009/0161704 A1 | 6/2009 | Weichmann et al. | |
| 2010/0022379 A1 | 1/2010 | Kittaka et al. | |
| 2014/0225123 A1 * | 8/2014 | Arkun | H01L 29/66462 257/76 |

* cited by examiner

*Primary Examiner* — Tuan N Nguyen
(74) *Attorney, Agent, or Firm* — Tue Nguyen

(57) ABSTRACT

A vertical cavity surface emitting laser (VCSEL) is formed on a substrate. The VCSEL includes a layer structure and one or more distributed Bragg reflector (DBR) mirrors formed on at least one of the layer structure or the substrate. The layer structure generates an optical signal at a first wavelength based on a control current received from a transistor that is formed on the substrate. Rare earth ions (REIs) are deposited in the one or more DBR mirrors such that the one or more DBR mirrors receive the optical signal at the first wavelength and generate the optical signal at a second wavelength.

18 Claims, 11 Drawing Sheets

US 10,530,125 B1

VERTICAL CAVITY SURFACE EMITTING LASER

FIELD OF THE INVENTION

The present invention relates generally to pixelated displays, and particularly to light emitting devices that employ photon up-conversion or photon down-conversion.

BACKGROUND

Pixelated displays are typically based on liquid crystal displays (LCDs) for displaying images and videos. Each pixel of the LCD is switched on and off using one or more transistors. The transistors are typically manufactured using complementary metal oxide semiconductor (CMOS) technology or thin film transistors (TFTs) and are formed on a backplane of the LCD device. However, integrating the backplane in the LCD device increases the thickness of the LCD device. Further, the LCD device includes a backlight system to generate light. The light is then incident on color filters for generating red, blue, and green lights. Thus, the LCD device becomes bulky due to integrating the backplane, backlight, and color filters on a common substrate.

Due to the above-mentioned disadvantages with conventional LCDs, vertical cavity surface emitting lasers (VCSELs) are being utilized as light emitting devices in pixelated displays. VCSELs are further utilized in various applications such as optical fiber data transmission, broadband signal transmission, laser printers, and applications of the like. VCSELs are monolithic lasers that include a resonant cavity, and are often fabricated using epitaxially grown structures of III-V semiconductors that are common to III-V transistor structures. The resonant cavity is realized between two distributed Bragg reflector (DBR) mirrors that are formed at the top and the bottom of the resonant cavity. In contrast to LEDs that are typically limited to an efficiency on the order of approximately 10% and yield incoherent light output, VCSELs can have efficiencies of approximately 40% with a highly collimated emissive light output.

Photon energy up-conversion is a process of sequentially absorbing two or more incident photons by nanoparticles, leading to an emission of light at a wavelength shorter than the wavelengths of the incident photons. Typically, lanthanide doped nanoparticles and semiconductor nanoparticles are used in applications for photon up-conversion. VCSELs emit light at specific wavelengths that can be modified using photon up-conversion. In the case of VCSELs that emit at wavelengths in the range of 900-1600 microns, for example, photon up-conversion can lead to output from these devices in the range of wavelengths in the visible light range.

Further, co-integration of VCSELs with monolithic transistor structures enables the control electronics for addressing individual pixels without the requirement for a backplane.

Thus, there is a need in the art for a pixelated light emitting device that can output wavelengths in the visible range without the need for a backplane.

BRIEF DESCRIPTION OF DRAWINGS

The following detailed description of the preferred embodiments of the present invention will be better understood when read in conjunction with the appended drawings. The present invention is illustrated by way of example, and not limited by the accompanying figures, in which like references indicate similar elements.

SUMMARY

Figure 1:
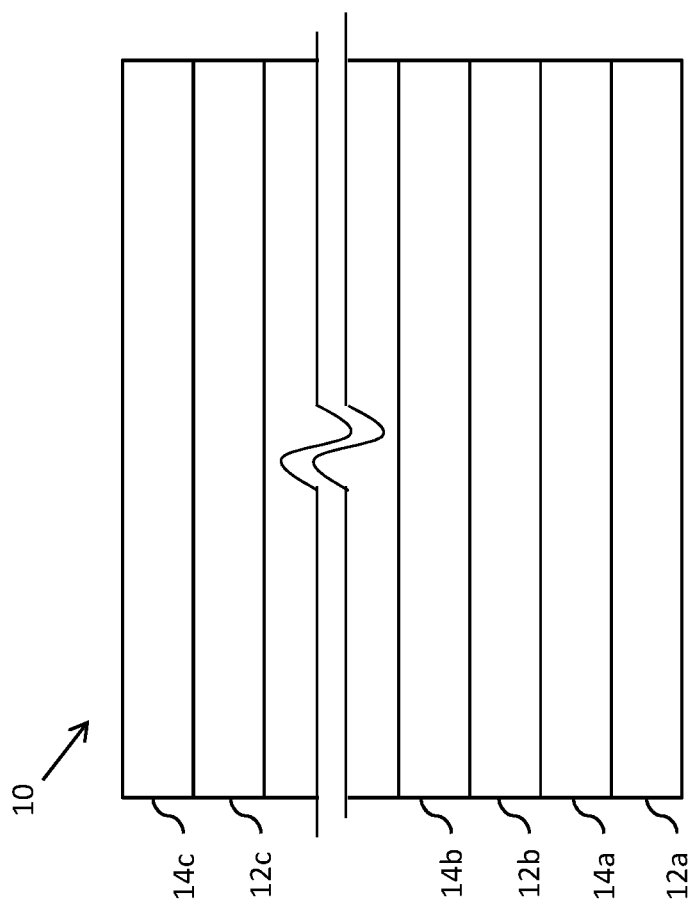
FIG. 1 is a cross sectional view of a prior art distributed Bragg reflector (DBR) mirror layer structure.

The detailed description of the appended drawings is intended as a description of the currently preferred embodiments of the present invention and is not intended to represent the only form in which the present invention may be practiced. It is to be understood that the same or equivalent functions may be accomplished by different embodiments that are intended to be encompassed within the spirit and scope of the present invention.

In one embodiment of the present invention, a device is provided. The device includes a light emitting device disposed between first and second distributed Bragg reflector (DBR) mirrors. At least one of the first and second DBR mirrors includes a plurality of rare earth elements incorporated therein.

In another embodiment of the present invention, a device is provided. The device includes a first distributed Bragg reflector (DBR) mirror disposed on a substrate. The first DBR mirror includes a layer structure disposed on the first DBR mirror. The layer structure is configured to emit a first optical signal at a first wavelength. A second DBR mirror is disposed on the layer structure. At least one of the first and second DBR mirrors includes a plurality of elements incorporated therein. The incorporation of the plurality of elements into the at least one of the first and second DBR mirrors is configured so that the at least one of the first and second DBR mirrors, upon exposure to the first optical signal, provides a second optical signal at a second wavelength that is different from the first wavelength.

In yet another embodiment of the present invention, a light emitting device is provided. The light emitting device includes an array of pixels that are formed on a substrate. Each pixel of the array of pixels includes a first transistor and at least one optical emitter. The at least one optical emitter includes a first distributed Bragg reflector (DBR) mirror disposed on the substrate, and a layer structure disposed on the first DBR mirror. The layer structure is configured to emit a first optical signal at a first wavelength. A second DBR mirror is disposed on the layer structure. At least one of the first and second DBR mirrors includes a plurality of rare earth elements configured to, upon exposure to the first optical signal, provide a second optical signal at a second wavelength that is different from the first wavelength.

In yet another embodiment of the present invention, a semiconductor device is provided. The semiconductor device includes a plurality of layers formed on a substrate. The plurality of layers includes a layer structure and one or more distributed Bragg reflector (DBR) mirrors. The layer structure emits an optical signal at a first wavelength based on a control current. The one or more DBR mirrors are in contact with the layer structure. Each of the one or more DBR mirrors includes a plurality of rare earth ions (REIs) deposited therein that receive the optical signal at the first wavelength from the layer structure and generate the optical signal at a second wavelength.

In yet another embodiment of the present invention, a light emitting device is provided. The light emitting device includes an array of pixels formed on a substrate. Each pixel of the array of pixels includes a transistor and at least one optical emitter. The at least one optical emitter includes a layer structure formed above the substrate. The layer structure emits an optical signal at a first wavelength based on a control current. The layer structure receives the control current from the transistor. The optical emitter further includes one or more distributed Bragg reflector (DBR) mirrors that are in contact with the layer structure. Each of the one or more DBR mirrors includes a plurality of rare earth ions (REIs) deposited therein that receive the optical signal at the first wavelength from the layer structure and generate an optical signal at the second wavelength.

Various embodiments of the present invention provide a light emitting device that includes an array of pixels formed on a substrate. Each pixel of the array of pixels includes an optical emitter and a transistor. The optical emitter is a vertical cavity surface emitting laser (VCSEL) and receives a control current from a transistor. The layer structure of the optical emitter generates an optical signal at a first wavelength based on the control current. The optical emitter further includes one or more distributed Bragg reflector (DBR) mirrors. The one or more DBR mirrors include multiple layers with alternating refractive indices and are formed on at least the substrate (i.e., to form a bottom DBR mirror) or the layer structure (i.e., to form a top DBR mirror). The one or more DBR mirrors further include rare earth ions (REIs) incorporated therein. The REIs receive the optical signal at the first wavelength. The REIs further absorb the optical signal at the first wavelength and emit the optical signal at a second wavelength.

Each pixel of the array of pixels, in those embodiments that include an array of pixels, includes at least one transistor for controlling each pixel individually. Further, the rare earth ions are incorporated in at least the top or bottom DBR mirror. This facilitates a high pumping efficiency of the light emitting device. Due to the high pumping efficiency, power consumed by the light emitting device is low.

DETAILED DESCRIPTION

The ensuing description provides exemplary embodiment(s) only, and is not intended to limit the scope, applicability or configuration of the disclosure. Rather, the ensuing description of the exemplary embodiment(s) will provide those skilled in the art with an enabling description for implementing an exemplary embodiment. It is understood that various changes may be made in the function and arrangement of elements without departing from the spirit and scope as set forth in the appended claims.

A "semiconductor" as used herein and throughout this disclosure refers to, but is not limited to, a material having an electrical conductivity value falling between that of a conductor and an insulator. The material may be an elemental material or a compound material. A semiconductor may include, but is not limited to, an element, a binary alloy, a tertiary alloy, and a quaternary alloy. Structures formed using a semiconductor or semiconductors may comprise a single semiconductor material, two or more semiconductor materials, a semiconductor alloy of a single composition, a semiconductor alloy of two or more discrete compositions, and a semiconductor alloy graded from a first semiconductor alloy to a second semiconductor alloy. A semiconductor may be one of undoped (intrinsic), p-type doped, n-typed doped, graded in doping from a first doping level of one type to a second doping level of the same type, and graded in doping from a first doping level of one type to a second doping level of a different type. Semiconductors may include, but are not limited to, III-V semiconductors, such as those between aluminum (Al), gallium (Ga), and indium (In) with nitrogen (N), phosphorous (P), arsenic (As) and tin (Sb), including for example GaN, GaP, GaAs, InP, InAs, AlN and AlAs.

A "metal" as used herein and throughout this disclosure refers to, but is not limited to, a material (element, compound, and alloy) that has good electrical and thermal conductivity. This may include, but is not limited to, gold, chromium, aluminum, silver, platinum, nickel, copper, rhodium, palladium, tungsten, and combinations of such materials.

An "electrode", "contact", "track", "trace", or "terminal" as used herein and throughout this disclosure refers to, but is not limited to, a material having good electrical conductivity and that is optically opaque. This includes structures formed from thin films, thick films, and plated films for example of materials including, but not limited to, metals such as gold, chromium, aluminum, silver, platinum, nickel, copper, rhodium, palladium, tungsten, and combinations of such materials. Other electrode configurations may employ combinations of metals, for example, a chromium adhesion layer and a gold electrode layer.

A "substrate" as used herein and throughout this disclosure refers to, but is not limited to, a surface upon which semiconductor structures, such as a photonic integrated circuit (PIC) and embodiments of the invention may be grown. This may include, but is not limited to, InP, GaAs, silicon, silica-on-silicon, silica, silica-on-polymer, glass, a metal, a ceramic, a polymer, or a combination thereof.

A "rare earth ion" or "REI" or "rare earth element" as used herein and throughout this disclosure refers to, but is not limited to, an atomic element, a group of elements, a nanoparticle of elements, or a cluster of elements from the set of fifteen lanthanides in the periodic table as well as scandium and yttrium. The atomic elements, the group of elements, the nanoparticles of elements, or clusters of elements from the set of fifteen lanthanides as well as scandium and yttrium may be in ionized form or otherwise, non-ionized form. The term "rare earth ion" is commonly used in the art to depict the rare earth elements but when incorporated into a deposited layer, the rare earth elements can be, but are not necessarily, in ionized form.

References to "an embodiment", "another embodiment", "yet another embodiment", "one example", "another example", "yet another example", "for example" and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in an embodiment" does not necessarily refer to the same embodiment.

Photon up-conversion is a process of sequentially absorbing two or more incident photons by nanoparticles, leading to emission of light at a wavelength shorter than the wavelengths of the incident photons. Photon down-conversion is a process of absorbing an incident photon by nanoparticles, leading to emission of two or more photons at wavelengths longer than the wavelength of the incident photon. Nanoparticles that are incorporated into the DBR mirror for the purposes of photon up-conversion or down-conversion may include lanthanide doped nanoparticles and semiconductor nanoparticles. The REIs may be one of lanthanides or lanthanide-like elements. The lanthanides include lanthanum, cerium, praseodymium, neodymium, promethium, samarium, europium, gadolinium, terbium, dysprosium, holmium, erbium, thulium, ytterbium, and lutetium. The lanthanide-like elements include scandium and yttrium, and the like.

The present application builds upon Planar Optoelectronic Technology (POET) that provides for the realization of a variety of devices (optoelectronic devices, logic circuits and/or signal processing circuits) utilizing inversion quantum-well channel devices. These device structures are built using a layered epitaxial structure and an associated fabrication sequence that can be used to fabricate the devices on a common substrate. In other words, n-type and p-type layers are grown epitaxially to maintain lattice matching integrity between the various layers in the structure, and common patterning steps, including critical etches, simultaneously across the common substrate to realize one or more devices simultaneously. Features of the epitaxial structure include, but are not limited to the following: 1) a bottom n-type layer structure, 2) a top p-type layer structure, and 3) an n-type modulation doped quantum well layer structure and a p-type modulation doped quantum well layer structure disposed between the bottom n-type layer structure and the top p-type layer structure, 4) heavily doped semiconductor contact layers, and 5) ohmic metal contacts to the heavily doped semiconductor contact layers. The epitaxial layer structure can be realized with a material system of group III-V materials (such as GaAs/AlGaAs). The n-type modulation doped quantum well includes a relatively thin layer of highly doped n-type material (referred to herein as an "N+ charge sheet") spaced from one or more quantum wells by an undoped spacer layer. The p-type modulation doped quantum well interface includes a relatively thin layer of highly doped p-type material (referred to herein as a "p+ charge sheet") spaced from one or more quantum wells by an undoped spacer layer. The N+ charge sheet is disposed above the quantum well(s) of the n-type modulation doped quantum well interface adjacent to the top p-type layer structure. The p+ charge sheet is disposed below the quantum well(s) of the p-type modulation doped quantum well interface adjacent to the bottom n-type layer structure. One or more spacer layers are disposed between the quantum well(s) of the n-type modulation doped quantum well interface and the one or more quantum well(s) of the p-type modulation doped quantum well interface. A bottom dielectric distributed Bragg reflector (DBR) mirror can be formed on the substrate prior to the deposition or growth of the bottom n-type layer structure. The bottom DBR mirror can be formed from alternating layers of AlAs and GaAs. The AlAs layers are subjected to, for example, high temperature steam oxidation to produce aluminum oxides within the bottom DBR mirror. A top dielectric mirror can be formed above the top p-type layer structure. The top dielectric mirror can be formed, for example, from alternating layers of $SiO_2$ and a high refractive index material such as silicon or titanium dioxide ($TiO_2$). The bottom and top mirrors provide for vertical confinement of light. The top dielectric mirror can cover the sidewalls of the device structure to provide for lateral confinement of light as needed. Transition layers are often utilized in epitaxial growth in which the composition of the constituent elements is varied in a gradual manner to reduce the stress, for example, at the interface between epitaxial layers. The use and inclusion of such transition layers is anticipated and implied in the formation of epitaxially grown, layered structures, where required.

POET can be used to construct a variety of high performance transistor devices, such as complementary (n-channel heterostructure Field effect transistor (NHFET) and p-channel heterostructure field effect transistor (PHFET) unipolar devices as well as n-type and p-type heterojunction bipolar transistor (HBT) devices. POET can also be used to construct a variety of optoelectronic devices which include:
  thyristor VCSEL lasers;
  NHFET lasers;
  PHFET lasers;
  thyristor optical detectors;
  NHFET optical detectors;
  PHFET optical detectors;
  semiconductor optical amplifiers (SOAs) and linear optical amplifiers (LOAs) based on either one (or both) of the n-type and p-type quantum well interfaces;
  absorption (intensity) optical modulators based on either one (or both) of the n-type and p-type quantum well interfaces;
  phase modulators based on either one (or both) of the n-type and p-type quantum well interfaces;
  waveguide switches; and
  passive waveguides.

Referring now to FIG. 1, a cross sectional view of a distributed Bragg reflector (DBR) mirror layer structure 10 is shown in accordance with prior art. In this figure, the DBR mirror layer structure 10 is a stacked layer structure and includes layers of alternating refractive indices. When two materials with different refractive indices are placed together to form an optical junction, light is reflected at the junction of the first and second materials. The amount of light reflected at one such junction is small. However, in applications such as DBR mirrors in which multiple junctions per layer pairs are stacked periodically with each layer having a quarter-wavelength optical thickness, the reflections from each of the boundaries are added in phase to produce a large amount of reflected light.

The DBR mirror layer structure 10 includes multiple layers of a first material, of which first through nth layers of the first material 12a-12c are shown, where n is the total number of layers of the first material. Each of the layers of the first material 12a-12c has a first refractive index. The DBR mirror layer structure 10 further includes multiple layers of a second material, of which first through nth layers of the second material 14a-14c are shown, where n is the total number of layers of the second material. Each of the layers of the second material 14a-14c has a second refractive index. Further, the first through (n−1)th layers of the second material 14a-14c are positioned between the corresponding first through nth layers of the first material 12a-12c. The top layer, by definition, terminates the DBR mirror layer structure 10, though not necessarily the overall device structure. Hence, the first layer of the second material 14a is epitaxially grown or deposited on the first layer of the first material 12a. The second layer of the first material 12b is epitaxially grown or deposited on the first layer of the second material 14a. The second layer of the second material 14b is epitaxially grown or deposited on the second layer of the first material 12b. Sequentially, this process is repeated until the nth layer of the first material 12c is epitaxially grown or deposited above the (n−1)th layer of the second material 14b. The nth layer of the second material 14c is epitaxially grown or deposited on the nth layer of the first material 12c. The number of layers in the DBR mirror can vary, and the number of layers, in general, will affect the internal reflection or reflectivity of the mirror structure. In some cases, the top layer of the second material is not included in the DBR mirror layer structure 10 and the first and last layers of the DBR mirror layer structure 10 are both of the first material.

Figures 2A, 2B:
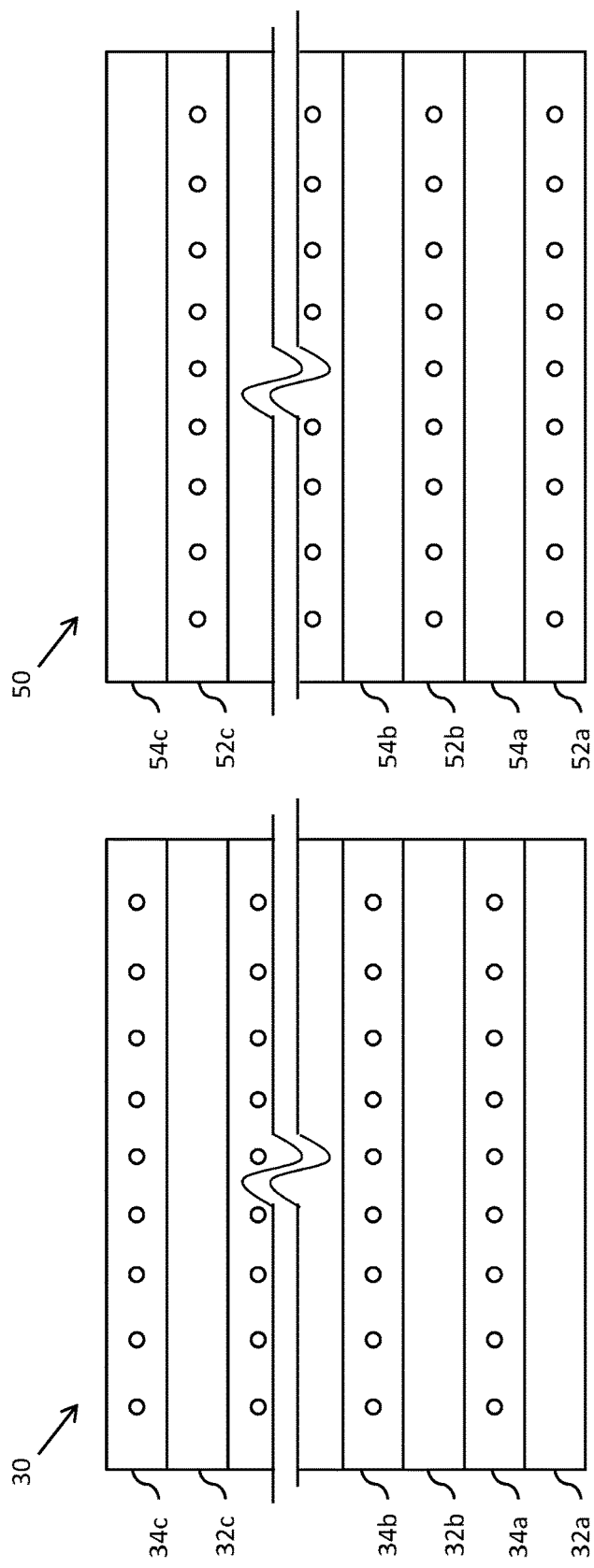
FIG. 2A is a cross sectional view of a distributed Bragg reflector (DBR) mirror layer structure that includes alternating layers of first and second materials, in which rare earth ions (REIs) are included in one or more layers of the second material, in accordance with an embodiment of the present invention.
FIG. 2B is a cross sectional view of a DBR mirror layer structure that includes the alternating layers of the first and second materials in which REIs are included in one or more layers of the first material, in accordance with another embodiment of the present invention.

Referring now to FIG. 2A, a cross sectional view of a DBR mirror layer structure 30 is shown in accordance with an embodiment of the present invention. In this embodiment, the DBR mirror layer structure 30 is a stacked layer structure and includes alternating layers of first and second materials with the inclusion of rare earth ions (REIs) into one or more layers of the second material in the DBR mirror layer structure 30.

The DBR mirror layer structure 30 includes multiple layers of the first material, of which first through nth layers of the first material 32a-32c are shown, where n is the total number of layers of the first material. In an example, the total number of layers of the first material is 10. Each of the layers of the first material 32a-32c has a first refractive index. The DBR mirror layer structure 30 further includes multiple layers of the second material, of which the first through nth layers of the second material 34a-34c are shown, where n is the total number of layers of the second material. In an example, the total number of layers of the second material is 10. Each of the layers of the second material 34a-34c has a second refractive index. Further, the first through (n−1)th layers of the second material 34a-34c are positioned between the corresponding first through nth layers of the first material 32a-32c. The top layer, i.e., the nth layer of the second material 34c, by definition, terminates the DBR mirror layer structure 30. Hence, the first layer of the second material 34a is epitaxially grown or deposited on the first layer of the first material 32a. The second layer of the first material 32b is epitaxially grown or deposited on the first layer of the second material 34a. The second layer of the second material 34b is epitaxially grown or deposited on the second layer of the first material 32b. Sequentially, this process is repeated until the nth layer of the first material 32c is epitaxially grown or deposited above the (n−1)th layer of the second material 34b. The nth layer of the second material 34c is epitaxially grown or deposited on the nth layer of the first material 32c. In an embodiment, REIs are included in one or more layers of the second material 34a-34c. It is to be understood that the number of layers in the DBR mirror layer structure 30 can vary, and that the number of layers, in general, is likely to affect the internal reflection of the DBR mirror layer structure 30. Variations in the number of layers, the indices of refraction of the layers, and the numbers of specific types of the layers in the DBR mirror layer structure 30, remain within the scope of the current invention. In an embodiment, the nth layer of the second material 34c is not included and the DBR mirror layer structure 30 is terminated with the nth layer of the first material 32c. It is also to be understood that other capping layers may be used above the DBR mirror layer structure 30 and remain within the scope of the present invention.

In an embodiment where the DBR mirror layer structure 30 is a bottom DBR mirror structure 30, the first material is oxidized AlAs, and the second material is GaAs. The AlAs layers are typically subjected to, high temperature steam oxidation to produce aluminum oxides. Use of alternating layers of AlAs and GaAs are used in a preferred embodiment to maintain epitaxial integrity for the layers deposited above the bottom DBR mirror structure 30. Alternatively, the first and second materials may include materials such as aluminum gallium arsenide (AlGaAs), aluminum nitride (AlN), gallium nitride (GaN), and the like. The DBR mirror layer structure 30 is manufactured using techniques such as chemical vapor deposition (CVD), metalorganic chemical vapor deposition (MOCVD), ion assisted electron beam deposition, atomic layer deposition (ALD), nanolayer deposition (NLD), molecular beam epitaxy (MBE), sputtering, solgel, thermal evaporation, electron evaporation, and the like.

The concentration of REIs in the DBR mirror layer structure 30 may be evenly distributed. In an embodiment, the REIs are introduced at various times or periodically introduced during the deposition or epitaxial growth of the DBR mirror layer structure 30. In another embodiment, a continuous layer or near continuous layer of the REIs is deposited at various times or at various depths during deposition or epitaxial growth of the DBR mirror layer structure 30. In yet another embodiment, a discontinuous amount of the REIs is deposited to prevent adverse effect on the adhesion between the layers of the DBR mirror layer structure 30. Many methods are known in the art of incorporating, mixing, and adding materials to a growing film structure. The embodiments described herein are intended to provide some examples of how the REIs are incorporated, integrated, co-deposited, mixed, or added into the DBR mirror layer structure 30, and are not intended to limit in any way the scope of the invention.

In the embodiment of the bottom DBR mirror structure 30, where the second material is GaAs and the layers are deposited using chemical vapor deposition (CVD), the REIs may be incorporated using a metalorganic precursor such as Tris(cyclopentadienyl)terbium(III), Tris(cyclopentadienyl) thulium(III), Tris(cyclopentadienyl)ytterbium(III), and Tris (cyclopentadienyl)lanthanum(III). A wide range of REI-containing metalorganic precursors are available to those skilled in the art and that can be used to provide REIs in CVD and ALD processing. These or other REI-containing precursors can be used to introduce REIs into the first layer of the second material of the bottom DBR mirror structure 30 and remain within the scope of the invention.

The incorporation of the REIs may further be accomplished with the introduction of metalorganic precursors into a CVD or ALD system during deposition of the alternating layers of the GaAs in the DBR mirror layer structure 30. Introduction of the precursors is accomplished in an embodiment using a continuous flow of REI-containing precursors with the precursors for the Ga and the As. Typical As-containing precursors include arsine, trimethylarsine (TMAs), triethylarsine (TEAs), triphenylarsine, phenylarsine, and the like. Typical Ga-containing precursors include trimethylgallium (TMG) and triethylgallium (TEG). In an embodiment, a fractional stoichiometric concentration of the REIs is included in the deposited GaAs film. In yet another embodiment, the introduction of the precursors is accomplished using a pulsed or periodic flow of REI-containing precursors during the deposition of the GaAs layers in the DBR mirror layer structure 30.

Figure 4A:
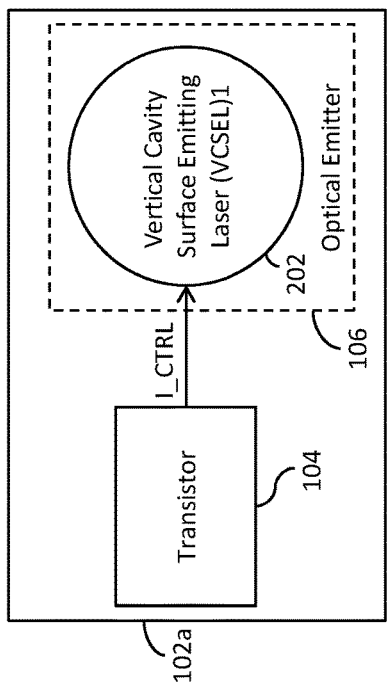
FIG. 4A is a schematic block diagram of a first pixel of the light emitting device of FIG. 3, in accordance with an embodiment of the present invention.
Figure 4C:
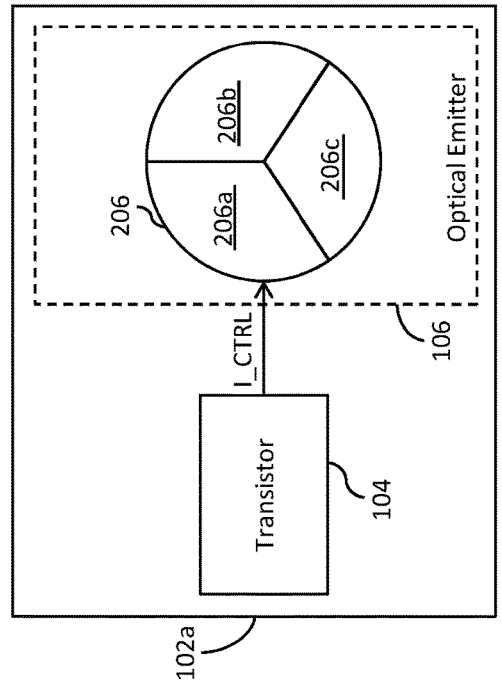
FIG. 4C is a schematic block diagram of the first pixel of the light emitting device of FIG. 3, in accordance with yet another embodiment of the present invention.
Figure 4B:
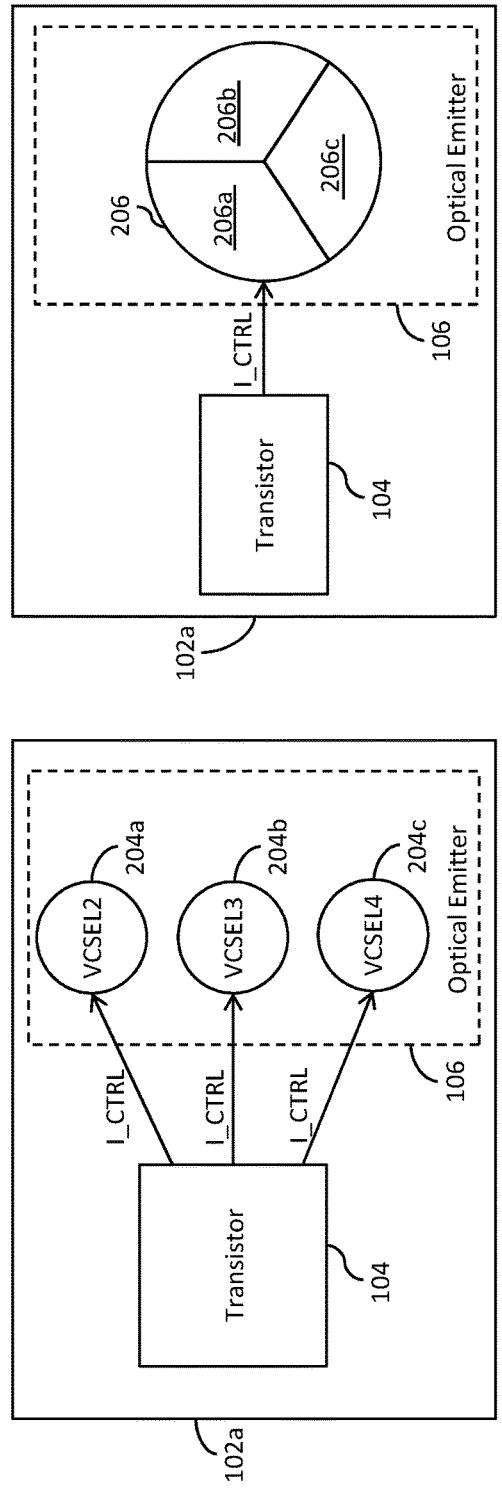
FIG. 4B is a schematic block diagram of the first pixel of the light emitting device of FIG. 3, in accordance with another embodiment of the present invention.

In another embodiment of the DBR mirror layer structure 30 with REIs, and one that is more typically suited as a top DBR mirror structure 30 in one of the first through fifth VCSELs 202, 204a, 204b, 204c, and 206 of FIGS. 4A-4C, the first and second materials may include materials such as silicon oxide ($SiO_x$), titanium oxide ($TiO_x$), titanium nitride ($TiN_x$), aluminum oxide ($Al_xO_y$), aluminum nitride ($AlN_x$), silicon oxynitride ($SiO_xN_y$), tantalum oxide ($Ta_xO_y$), tantalum nitride ($TaN_x$), and the like. Additionally, other transparent insulating layers of sulfides, such as zinc sulfide, and fluorides such as calcium fluoride, may also be used in embodiments of the DBR mirror layer structure 30. In general, although epitaxial layers can be used for the top DBR mirror structure 30, the top DBR mirror structure 30 may not require epitaxial growth since the top DBR mirror structure 30 is the topmost structure of the first through fifth VCSELs 202, 204a, 204b, 204c, and 206 of FIGS. 4A-4C and additional epitaxially grown layers are not required above the top DBR mirror structure 30. Microcrystalline and amorphous films allow for the use of sputtering equipment to form the top DBR mirror structure 30, the advantages of which are known to those skilled in the art and include simplified deposition processing and lower film deposition temperatures.

In an embodiment, the DBR mirror layer structure 30 is formed using one or more sputtering techniques that may be one or more of direct current (DC) and radio-frequency (RF) sputtering. In embodiments in which silicon oxide is used, for either the first material, as in films of first material 32a-32c, or the second material, as in films of the second material 34a-34c, the silicon oxide films are deposited using sputtering. Many methods for depositing silicon oxide films are known by those skilled in the art. In an embodiment in which silicon oxide films are utilized in the DBR mirror layer structure 30, the silicon oxide films are deposited using a sputtering process in which a silicon target is used as a source of silicon and an oxygen containing gas or gas mixture is used to sputter the silicon from the silicon target. In yet another embodiment, silicon oxide films are deposited using a sputtering process in which a silicon oxide target is used with one or more of an inert gas, a reactive gas, a mixture of inert gases, a mixture of reactive gases, or a mixture of inert and reactive gases. Inert gases include argon, helium, neon, and the other noble gases. Reactive gases include oxygen, nitrogen, and oxygen- and nitrogen-containing gases such as nitrous oxide ($N_2O$) and nitric oxide (NO). Sputtered oxide films may include some nitrogen and conversely, sputtered nitride films may include oxygen. Other reactive gases include gases specific to the type of film or films used in the DBR mirror layer structure 30, such as sulfur-containing gases for the purposes of forming a sulfide, and a fluorine-containing gas for the purposes of forming a fluoride.

Inclusion of the REIs into the growing films, such as the silicon oxide films, for example, is accomplished in an embodiment using a co-sputtering technique in which an REI-containing target is sputtered concurrently with the silicon or silicon oxide target. In yet another embodiment, the REI-containing target is periodically sputtered either concurrently with the silicon or silicon oxide target, or non-concurrently. In embodiments, sputtering rates of the silicon oxide films and the REI-containing target are set so as to provide a desired stoichiometric concentration or range of stoichiometric concentrations of the REI atoms in the silicon oxide films. In yet another embodiment, sputtering targets that include REIs are utilized. The REIs are incorporated into the silicon or silicon oxide target at a concentration such that the desired concentration of the REIs in the growing film is obtained. Numerous sputtering and co-sputtering methods and configurations are known in the art for the fabrication of thin films of silicon oxide, and for the fabrication of thin film compounds of silicon oxide with co-sputtered elements such as REIs.

The concentrations of the REIs can vary from a few hundredths of a percent of the total atomic concentration of the films used in the DBR mirror layer structure 30 to tens of percent of the total atomic concentration of the films used in the DBR mirror layer structure 30. The concentration of the REI material in the films can affect both the re-emission of absorbed light and the reflectivity characteristics of the DBR mirror layer structure 30.

The concentration of the REIs in the DBR mirror layer structure 30 need not be constant across an individual layer in the DBR mirror layer structure 30, nor does it need to be the same concentration across each of the films in the stack.

By way of example, the use of sputtering and co-sputtering processes for embodiments in which silicon oxide films are utilized in the DBR mirror layer structure 30 with the incorporation of REIs have been described. Similarly, embodiments for other oxide films such as titanium oxide, aluminum oxide, tantalum oxide, for example, or any other transparent metal or semiconductor oxides can be similarly implemented that provide the required optical properties for the DBR mirror layer structure 30.

Likewise, embodiments in which nitrides are utilized in one or more of the films in the DBR mirror layer structure 30, targets made of the aluminum, titanium, tantalum, or another metal or semiconductor, can be utilized with nitrogen-containing sputtering gas, or nitride targets can be utilized with reactive or inert gas mixtures to fabricate the films.

Likewise, embodiments in which sulfides are utilized in one or more of the films in the DBR mirror layer structure 30, targets fabricated from a metal or semiconductor, can be utilized with sulfur-containing sputtering gas as described for the silicon target, or sulfide targets can be utilized with reactive or inert gas mixtures to fabricate the films.

Likewise, embodiments in which fluorides are utilized in one or more of the films in the DBR mirror layer structure 30, targets made a metal or semiconductor, can be utilized with fluorine-containing sputtering gas, or fluoride targets can be utilized with reactive or inert gas mixtures to fabricate the films.

By way of example, in an embodiment for the top DBR mirror structure 30, the first material 32a-32c is silicon dioxide and the second material 34a-34c is titanium oxide, and the REIs are included in the titanium oxide. In this embodiment, the silicon oxide layers and the titanium oxide layers are deposited using one or more sputtering techniques. The REIs are incorporated into the second material, the titanium oxide, using either concurrent or non-concurrent co-sputtering, or with an REI-containing titanium sputter target. The REIs are included either in the growing titanium oxide film continuously, or periodically. The concentration of the REIs in the titanium oxide need not be constant and need not extend through the full thickness of the film.

In other embodiments, other processing techniques such as ALD, CVD, physical vapor deposition (PVD), ion beam assisted deposition, ion beam deposition, and the like can be used separately or in conjunction with a sputtering process to introduce the REIs into the layers of second material, i.e., the titanium oxide film in the exemplary embodiment.

Alternatively, the REIs can be implanted into the films after growth using ion implantation. In another embodiment, the REIs are diffused into the DBR mirror layer structure 30. In yet another embodiment, the REIs are deposited, via CVD, sputtering, or another technique, at one or more of the interfaces of the DBR mirror layer structure 30 between the alternating layers of the DBR mirror layer structure 30 using CVD.

Referring now to FIG. 2B, a cross sectional view of a DBR mirror layer structure 50 is shown in accordance with another embodiment of the present invention. In this embodiment, the DBR mirror layer structure 50 is a stacked layer structure and includes alternating layers of first and second materials with the inclusion of REIs into one or more of the layers of the first material in the DBR mirror layer structure 50.

The DBR mirror layer structure 50 includes multiple layers of the first material, of which first through nth layers of the first material 52a-52c are shown, where n is the total number of layers of the first material. In an example, the total number of layers of the first material is 10. Each of the layers of the first material 52a-52c has a first refractive index. The DBR mirror layer structure 50 further includes multiple layers of the second material, of which the first through nth layers of the second material 54a-54c are shown, where n is the total number of layers of the second material. In an example, the total number of layers of the second material is 10. Each of the layers of the second material 54a-54c has a second refractive index. Further, the first through (n−1)th layers of the second material 54a-54c are positioned between the corresponding first through nth layers of the first material 52a-52c. The top layer, by definition, terminates the DBR mirror layer structure 50, though not necessarily the overall device structure that includes the DBR mirror layer structure 50. Hence, the first layer of the second material 54a is epitaxially grown or deposited on the first layer of the first material 52a. The second layer of the first material 52b is epitaxially grown or deposited on the first layer of the second material 54a. The second layer of the second material 54b is epitaxially grown or deposited on the second layer of the first material 52b. Sequentially, this process is repeated until the nth layer of the first material 52c is epitaxially grown or deposited above the (n−1)th layer of the second material 54b. The nth layer of the second material 54c is epitaxially grown or deposited on the nth layer of the first material 52c. In the DBR mirror layer structure 50, REIs are included in one or more layers of the first material 52a-52c. It is to be understood that the number of layers in the DBR mirror layer structure 50 can vary, and that the number of layers, in general, is likely to affect the internal reflection of the DBR mirror layer structure 50. Variations in the number of layers, the indices of refraction of the layers, and the numbers of specific types of the layers in the DBR mirror layer structure 50, remain within the scope of the current invention. In some embodiments, the top layer of the DBR mirror layer structure 50 is the same as the first layer (i.e., the nth layer of the second material is excluded.)

In an embodiment where the DBR mirror layer structure 50 is a bottom DBR mirror structure 50, the first material is oxidized AlAs, and the second material is GaAs. The AlAs layers can be subjected to, for example, high temperature steam oxidation to produce aluminum oxides. Use of alternating layers of AlAs and GaAs are used in a preferred embodiment to maintain epitaxial integrity for the layers deposited above the bottom DBR mirror structure 50. Alternatively, the first and second materials may include materials such as aluminum gallium arsenide (AlGaAs), aluminum nitride (AlN), gallium nitride (GaN), and the like. The DBR mirror layer structure 50 is manufactured using techniques such as CVD, MOCVD, ALD, NLD, MBE, sputtering, solgel, thermal evaporation, electron evaporation, and the like. It is to be understood that the REIs can be incorporated into one or more of the layers of the first material and remain within the scope of the current invention.

The concentration of REIs in the DBR mirror layer structure 50 may be, but is not necessarily, evenly distributed. In an embodiment, the REIs are introduced at various times or periodically introduced during the deposition or epitaxial growth of the DBR mirror layer structure 50. In another embodiment, a continuous layer or near continuous layer of the REIs is deposited at various times or at various depths during deposition or epitaxial growth of the DBR mirror layer structure 50. In yet another embodiment, a discontinuous amount of the REIs is deposited to prevent adverse effect on the adhesion between the layers of the DBR mirror layer structure 50. Many methods are known in the art of incorporating, mixing, and adding materials to a growing film structure. The embodiments described herein are intended to provide some examples of how the REIs are incorporated, integrated, co-deposited, mixed, or added into the DBR mirror layer structure 50, and are not intended to limit in any way the scope of the invention.

In an embodiment of the bottom DBR mirror structure 50 where the second material is AlAs and the layers are deposited using CVD, the REIs may be incorporated using a metalorganic precursor such as Tris(cyclopentadienyl) terbium(III), Tris(cyclopentadienyl)thulium(III), Tris(cyclopentadienyl)ytterbium(III), and Tris(cyclopentadienyl)lanthanum(III). These or other REI-containing precursors can be used to introduce REIs into the first layer of first material of the bottom DBR mirror structure 50 and remain within the scope of the invention.

The incorporation of the REIs is accomplished with the introduction of metalorganic precursors into a CVD system during deposition of the alternating layers of the AlAs in the DBR mirror layer structure 50. Introduction of the precursors is accomplished in an embodiment using a continuous flow of REI-containing precursors with the precursors for the Al and the As. Typical Al-containing CVD precursors include trimethylaluminum, for example. Typical As-containing precursors include arsine, trimethylarsine (TMAs), triethylarsine (TEAs), triphenylarsine, phenylarsine, and the like. Typical Al-containing precursors include trimethylaluminum (TMA) and dimethylaluminum chloride (DMACl). In an embodiment, a fractional stoichiometric concentration of the REIs is included in the deposited AlAs film. In yet another embodiment, the introduction of the precursors is accomplished using a pulsed or periodic flow of REI-containing precursors during the deposition of the AlAs layers in the DBR mirror layer structure 50.

Alternatively, the REIs can be implanted into the films after growth using ion implantation. In another embodiment, the REIs are diffused into the DBR mirror layer structure 50. In yet another embodiment, the REIs are deposited, via CVD, sputtering, or another technique, at one or more of the interfaces of the DBR mirror layer structure 50 between the alternating layers of the DBR mirror layer structure 50 using CVD.

It is to be understood that the REIs can be incorporated into one or more of the layers of the first material and remain within the scope of the current invention.

In another embodiment of the DBR mirror layer structure 50 with REIs, and one that is more typically suited for a top DBR mirror structure 50 in the first through fifth VCSELs 202, 204a-204c, and 206 of FIGS. 4A-4C, the first and second materials may include materials such as silicon oxide ($SiO_x$), titanium oxide ($TiO_x$), titanium nitride ($TiN_x$), aluminum oxide ($Al_xO_y$), aluminum nitride ($AlN_x$), silicon oxynitride ($SiO_xN_y$), tantalum oxide ($Ta_xO_y$), tantalum nitride ($TaN_x$), and the like. Additionally, other transparent insulating layers of sulfides such as zinc sulfide, and fluorides such as calcium fluorides, can also be used in embodiments of the DBR mirror layer structure 50 within the scope of the current invention. In general, although epitaxial layers can be used for the top DBR mirror structure 50, the top DBR mirror structure 50 may not require epitaxial growth since the top DBR mirror structure 50 is the topmost structure of the first through fifth VCSELs 202, 204a, 204b, 204c, and 206 of FIGS. 4A-4C and additional epitaxially grown layers are not required above the top DBR mirror structure 50. Microcrystalline and amorphous films allow for the use of sputtering equipment to form the top DBR mirror structure 50, the advantages of which are known to those skilled in the art and include simplified deposition processing and lower film deposition temperatures.

In an embodiment, the DBR mirror layer structure 50 is formed using one or more sputtering techniques that may be one or more of direct current (DC) and radio-frequency (RF) sputtering. In embodiments in which silicon oxide is used, for either the first material, as in films of first material 52a-52c, or the second material, as in films of the second material 54a-54c, the silicon oxide films are deposited using sputtering. Many methods for depositing silicon oxide films are known by those skilled in the art. In an embodiment in which silicon oxide films are utilized in the DBR mirror layer structure 50, the silicon oxide films are deposited using a sputtering process in which a silicon target is used as a source of silicon and an oxygen containing gas or gas mixture is used to sputter the silicon from the silicon target. In yet another embodiment, silicon oxide films are deposited using a sputtering process in which a silicon oxide target is used with one or more of an inert gas, a reactive gas, a mixture of inert gases, a mixture of reactive gases, or a mixture of inert and reactive gases. Inert gases include argon, helium, neon, and the other noble gases. Reactive gases include oxygen, nitrogen, and oxygen- and nitrogen-containing gases such as nitrous oxide ($N_2O$) and nitric oxide (NO). Sputtered oxide films may include some nitrogen and conversely, the sputtered nitride films may include oxygen. Other reactive gases include gases specific to the type of film or films used in the DBR mirror layer structure 50, such as sulfur-containing gases for the purposes of forming a sulfide, and a fluorine-containing gas for the purposes of forming a fluoride.

Inclusion of the REIs into the growing films, such as the silicon oxide films, for example, is accomplished in an embodiment using a co-sputtering technique in which an REI-containing target is sputtered concurrently with the silicon or silicon oxide target. In yet another embodiment, the REI-containing target is periodically sputtered either concurrently with the silicon or silicon oxide target, or non-concurrently. In embodiments, sputtering rates of the silicon oxide films and the REI-containing target are set so as to provide a desired stoichiometric concentration or range of stoichiometric concentrations of the REI atoms in the silicon oxide films. In yet another embodiment, REI-containing sputtering targets are utilized in which the REIs are incorporated into the silicon or silicon oxide target at a concentration such that the desired concentration of the REIs in the growing film is provided. Numerous sputtering and co-sputtering methods and configurations are known in the art for the fabrication of thin films of silicon oxide, and for the fabrication of thin film compounds of silicon oxide with co-sputtered elements such as REIs.

The concentrations of the REIs can vary from a few hundredths of a percent of the total atomic concentration of the films used in the DBR mirror layer structure 50 to tens of percent of the total atomic concentration of the films used in the DBR mirror layer structure 50. The concentration of the REI material in the films is likely to affect both the re-emission of absorbed light and the reflectivity characteristics of the DBR mirror layer structure 50.

The concentration of the REIs in the DBR mirror layer structure 50 need not be constant across an individual layer in the DBR mirror layer structure 50, nor does it need to be the same concentration across each of the films in the DBR mirror layer structure 50.

By way of example, the use of sputtering and co-sputtering processes for embodiments in which silicon oxide films are utilized in the DBR mirror layer structure 50 with the incorporation of REIs have been described. Similarly, embodiments for other oxide films such as titanium oxide, aluminum oxide, tantalum oxide, for example, or any other transparent metal or semiconductor oxides can be similarly implemented that provide the required optical properties for the DBR mirror layer structure 50.

Likewise, embodiments in which nitrides are utilized in one or more of the films in the DBR mirror layer structure 50, targets made of aluminum, titanium, tantalum, or another metal or semiconductor, may be utilized with nitrogen-containing sputtering gas as described for the silicon target, or nitride targets can be utilized with reactive or inert gas mixtures to fabricate the films.

Likewise, embodiments in which sulfides are utilized in one or more of the films in the DBR mirror layer structure 50, targets made of a metal or semiconductor, can be utilized with sulfur-containing sputtering gas as described for the silicon target, or sulfide targets can be utilized with reactive or inert gas mixtures to fabricate the films.

Likewise, embodiments in which fluorides are utilized in one or more of the films in the DBR mirror layer structure 50, targets made of a metal or semiconductor, may be utilized with fluorine-containing sputtering gas, or fluoride targets can be utilized with reactive or inert gas mixtures to fabricate the films.

In an embodiment for the top DBR mirror structure 50, the first material 52a-52c is silicon dioxide and the second material 54a-54c is titanium oxide, and the REIs are included in the silicon oxide. In this embodiment, the silicon oxide layers and the titanium oxide layers are deposited using one or more sputtering techniques. The REIs are incorporated into the first material, the silicon oxide, using either concurrent or non-concurrent co-sputtering, or with an REI-containing silicon sputter target. The REIs are included either in the growing silicon oxide film continuously, or periodically. The concentration of the REIs in the silicon oxide need not be constant and need not extend through the full thickness of the film.

In other embodiments, other processing techniques such as ALD, CVD, PVD, ion beam assisted deposition, ion beam deposition, and the like can be used separately or in conjunction with a sputtering process to introduce the REIs into the layers of the first material, i.e., the silicon oxide film in the exemplary embodiment.

Figure 2C:
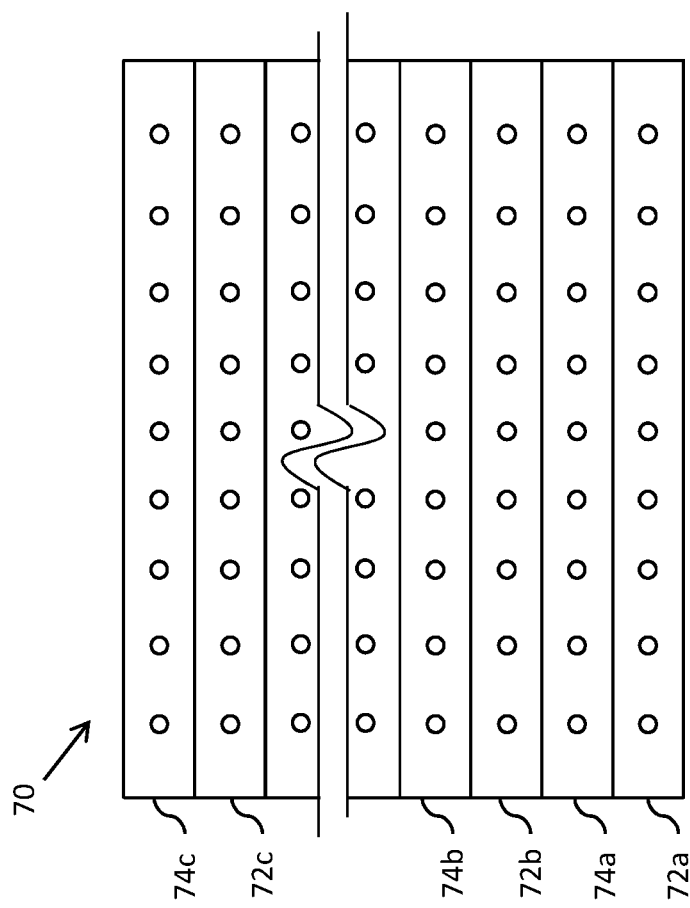
FIG. 2C is a cross sectional view of a DBR mirror layer structure that includes the alternating layers of first and second materials in which REIs are included in one or more layers of the first and second materials, in accordance with yet another embodiment of the present invention.

Referring now to FIG. 2C, a cross sectional view of a DBR mirror layer structure 70 is shown in accordance with yet another embodiment of the present invention. In this embodiment, the DBR mirror layer structure 70 is a stacked layer structure and includes alternating layers of first and second materials with the inclusion of REIs into one or more of the layers of the first and second materials in the DBR mirror layer structure 70.

The DBR mirror layer structure 70 includes multiple layers of the first material, of which first through nth layers of the first material 72a-72c are shown, where n is the total number of layers of the first material. In an example, the total number of layers of the first material is 10. Each of the layers of the first material 72a-72c has a first refractive index. The DBR mirror layer structure 70 further includes multiple layers of a second material, of which the first through nth layers of the second material 74a-74c are shown, where n is the number of layers of the second material. In an example, the total number of layers of the second material is 10. Each of the layers of the second material 74a-74c has a second refractive index. Further, the first through (n−1)th layers of the second material 74a-74c are positioned between the corresponding first through nth layers of the first material 72a-72c. The top layer, by definition, terminates the DBR mirror layer structure 70, though not necessarily the overall device structure that includes the DBR mirror layer structure 70. Hence, the first layer of the second material 74a is epitaxially grown or deposited on the first layer of the first material 72a. The second layer of the first material 72b is epitaxially grown or deposited on the first layer of the second material 74a. The second layer of the second material 74b is epitaxially grown or deposited on the second layer of the first material 72b. Sequentially, this process is repeated until the nth layer of the first material 72c is epitaxially grown or deposited above the (n−1)th layer of the second material 74b. The nth layer of the second material 74c is epitaxially grown or deposited on the nth layer of the first material 72c. In the DBR mirror layer structure 70, REIs are included in one or more of the layers of the first material 72a-72c and one or more of the layers of the second material 74a-74c. It is to be understood that the number of layers in the DBR mirror layer structure 70 can vary, and that the number of layers, in general, is likely to affect the internal reflection of the DBR mirror layer structure 70. Variations in the number of layers, the indices of refraction of the layers, and the numbers of specific types of the layers in the DBR mirror layer structure 70, remain within the scope of the current invention. The REIs need not be included in all of the first and second layers in the DBR mirror layer structure 70. The REIs can be included in at least one of more of the layers of the first material 72a-72c and in one or more of the layers of the second material 74a-74c.

In an embodiment where the DBR mirror layer structure 70 is implemented as a bottom DBR mirror structure 70, the first material is oxidized AlAs, and the second material is GaAs. The AlAs layers can be subjected to, for example, high temperature steam oxidation to produce aluminum oxides. Use of alternating layers of AlAs and GaAs are used in a preferred embodiment to maintain epitaxial integrity for the layers deposited above the bottom DBR mirror structure 70. Alternatively, the first and second materials may include materials such as aluminum gallium arsenide (AlGaAs), aluminum nitride (AlN), gallium nitride (GaN), and the like. The DBR mirror layer structure 70 can be manufactured using techniques such as CVD, MOCVD, ALD, NLD, MBE, sputtering, solgel, thermal evaporation, electron evaporation, and the like. It is to be understood that the REIs can be incorporated into one or more of the layers of the first or second material and remain within the scope of the current invention.

In the DBR mirror layer structure 70, one or more of the layers of the first material 72a-72c and one or more of the layers of the second material 74a-74c include the REIs. The concentration of REIs in the DBR mirror layer structure 70 may be, but not necessarily be, evenly distributed. In an embodiment, the REIs are introduced at various times or periodically introduced during the deposition or epitaxial growth of the DBR mirror layer structure 70. In another embodiment, a continuous layer or near continuous layer of the REIs is deposited at various times or at various depths during deposition or epitaxial growth of the DBR mirror layer structure 70. In yet another embodiment, a discontinuous amount of the REIs is deposited to prevent adverse effect on the adhesion between the layers of the DBR mirror layer structure 70. Many methods are known in the art of incorporating, mixing, and adding materials to a growing film structure. The embodiments described herein are intended to provide some examples of how the REIs are incorporated, integrated, co-deposited, mixed, or added into the DBR mirror layer structure 70, and are not intended to limit in any way the scope of the invention.

In an embodiment where the DBR mirror layer structure 70 is implemented as a bottom DBR mirror structure 70, the first material is oxidized AlAs, and the second material is GaAs. Use of alternating layers of AlAs and GaAs are used in a preferred embodiment to maintain epitaxial integrity for the layers deposited above the bottom DBR mirror structure 70. In an embodiment, the DBR mirror layer structure 70 is deposited using CVD. In an embodiment in which the first material is AlAs and the second material is GaAs and the layers are deposited using CVD, the REIs can be incorporated using one or more metalorganic precursors such as Tris(cyclopentadienyl)terbium(III), Tris(cyclopentadienyl)thulium(III), Tris(cyclopentadienyl)ytterbium(III), and Tris(cyclopentadienyl)lanthanum(III). These or other REI-containing precursors can be used to introduce REIs into the DBR mirror layer structure 70 and remain within the scope of the invention.

The REIs are incorporated into the layers of the first material, AlAs, and the layers of the second material, the GaAs, with the introduction of metalorganic precursors into a CVD system during deposition of the alternating layers of the AlAs and the GaAs in the DBR mirror layer structure 70. Introduction of the precursors is accomplished in an embodiment using a continuous flow of REI-containing precursors with the precursors for the Al and the As for the AlAs layers and with the precursors for the Ga and As precursors for the GaAs layers. Typical Al-containing CVD precursors may include trimethylaluminum. Typical As-containing precursors may include arsine, trimethylarsine (TMAs), triethylarsine (TEAs), triphenylarsine, phenylarsine, and the like. Typical Ga-containing precursors include trimethylgallium (TMG) and triethylgallium (TEG). In an embodiment, a fractional stoichiometric concentration of the REIs is included in one or more of the deposited AlAs layers and in the GaAs layers. In another embodiment, the introduction of the precursors is accomplished using a pulsed or periodic flow of REI-containing precursors during the deposition of the REI-containing layers in the DBR mirror layer structure 70.

Alternatively, the REIs can be implanted into the films after growth using ion implantation. In another embodiment, the REIs are diffused into the DBR mirror layer structure 70. In yet another embodiment, the REIs are deposited, via CVD, sputtering, or another technique, at one or more of the interfaces of the DBR mirror layer structure 70 between the alternating layers of the DBR mirror layer structure 70 using CVD.

It is to be understood that the REIs can be incorporated into one or more of the layers of the first material and remain within the scope of the current invention.

In another embodiment of the DBR mirror layer structure 70 with REIs, and one that is more typically suited for a top DBR mirror structure 70 in the first through fifth VCSELs 202, 204a-204c, and 206 of FIGS. 4A-4C, the first and second materials may include materials such as silicon oxide ($SiO_x$), titanium oxide ($TiO_x$), titanium nitride ($TiN_x$), aluminum oxide ($Al_xO_y$), aluminum nitride ($AlN_x$), silicon oxynitride ($SiO_xN_y$), tantalum oxide ($Ta_xO_y$), tantalum nitride ($TaN_x$), and the like. Additionally, other transparent insulating layers of sulfides such as zinc sulfide, and fluorides such as calcium fluorides, can also be used in embodiments of the DBR mirror layer structure 70 within the scope of the current invention. In general, although epitaxial layers can be used for the top DBR mirror structure 70, the top DBR mirror structure 70 does not require epitaxial growth since the top DBR mirror structure 70 is the topmost structure of the first through fifth VCSELs 202, 204a-204c, and 206 of FIGS. 4A-4C and additional epitaxially grown layers are not required above the top DBR mirror structure 70. Microcrystalline and amorphous films allow for the use of sputtering equipment to form the top DBR mirror structure 70, the advantages of which are known to those skilled in the art and include simplified deposition processing and lower film deposition temperatures.

In an embodiment, the DBR mirror layer structure 70 is formed using one or more sputtering techniques that may be one or more of direct current (DC) and radio-frequency (RF) sputtering. In embodiments in which silicon oxide is used, for either the first material, as in films of first material 72a-72c, or the second material, as in films of the second material 74a-74c, the silicon oxide films are deposited using sputtering. Many methods for depositing silicon oxide films are known by those skilled in the art. In an embodiment in which silicon oxide films are utilized in the DBR mirror layer structure 70, the silicon oxide films are deposited using a sputtering process in which a silicon target is used as a source of silicon and an oxygen containing gas or gas mixture is used to sputter the silicon from the silicon target. In another embodiment, silicon oxide films are deposited using a sputtering process in which a silicon oxide target is used with one or more of an inert gas, a reactive gas, a mixture of inert gases, a mixture of reactive gases, or a mixture of inert and reactive gases. Inert gases include argon, helium, neon, and the other noble gases. Reactive gases include oxygen, nitrogen, and oxygen- and nitrogen-containing gases such as nitrous oxide ($N_2O$), and nitric oxide (NO). Sputtered oxide films may include some nitrogen and conversely, the sputtered nitride films may include oxygen. Other reactive gases include gases specific to the type of film or films used in the DBR mirror layer structure 70, such as sulfur-containing gases for the purposes of forming a sulfide, and a fluorine-containing gas for the purposes of forming a fluoride.

Inclusion of the REIs into the growing films, such as the silicon oxide films, for example, is accomplished in an embodiment using a co-sputtering technique in which an REI-containing target is sputtered concurrently with the silicon or silicon oxide target. In another embodiment, the REI-containing target is periodically sputtered either concurrently with the silicon or silicon oxide target, or non-concurrently. In embodiments, sputtering rates of the silicon oxide films and the REI-containing target are set so as to provide a desired stoichiometric concentration or range of stoichiometric concentrations of the REI atoms in the silicon oxide films. In yet another embodiment, REI-containing sputtering targets are utilized in which the REIs are incorporated into the silicon or silicon oxide target at a concentration such that the desired concentration of the REIs in the growing film is provided. Numerous sputtering and co-sputtering methods and configurations are known in the art for the fabrication of thin films of silicon oxide, and for the fabrication of thin film compounds of silicon oxide with co-sputtered elements such as REIs.

The concentrations of the REIs can vary from a few hundredths of a percent of the total atomic concentration of the films used in the DBR mirror layer structure 70 to tens of percent of the total atomic concentration of the films used in the DBR mirror layer structure 70. The concentration of the REI material in the films will affect both the re-emission of absorbed light and the reflectivity characteristics of the DBR mirror layer structure 70.

The concentration of the REIs in the DBR mirror layer structure 70 need not be constant across an individual layer in the DBR mirror layer structure 70, nor does it need to be the same concentration across each of the films in the DBR mirror layer structure 70.

By way of example, the use of sputtering and co-sputtering processes for embodiments in which silicon oxide films are utilized in the DBR mirror layer structure 70 with the incorporation of REIs have been described. Similarly, embodiments for other oxide films such as titanium oxide, aluminum oxide, tantalum oxide, for example, or any other transparent metal or semiconductor oxides can be similarly implemented that provide the required optical properties for the DBR mirror layer structure 70.

Likewise, embodiments in which nitrides are utilized in one or more of the films in the DBR mirror layer structure 70, targets made of aluminum, titanium, tantalum, or another metal or semiconductor, may be utilized with nitrogen-containing sputtering gas as described for the silicon target, or nitride targets can be utilized with reactive or inert gas mixtures to fabricate the films.

Likewise, embodiments in which sulfides are utilized in one or more of the films in the DBR mirror layer structure 70, targets made of a metal or semiconductor, can be utilized with sulfur-containing sputtering gas as described for the silicon target, or sulfide targets can be utilized with reactive or inert gas mixtures to fabricate the films.

Likewise, embodiments in which fluorides are utilized in one or more of the films in the DBR mirror layer structure 70, targets made of a metal or semiconductor, may be utilized with fluorine-containing sputtering gas, or fluoride targets can be utilized with reactive or inert gas mixtures to fabricate the films.

In an embodiment for the top DBR mirror structure 70, the first material 72a-72c is silicon dioxide and the second material 74a-74c is titanium oxide, and the REIs are included in the silicon oxide. In this embodiment, the silicon oxide layers and the titanium oxide layers are deposited using one or more sputtering techniques. The REIs are incorporated into the first material, the silicon oxide, using either concurrent or non-concurrent co-sputtering, or with an REI-containing silicon sputter target. The REIs are included either in the growing silicon oxide film continuously, or periodically. The concentration of the REIs in the silicon oxide need not be constant and need not extend through the full thickness of the film.

In other embodiments, other processing techniques such as ALD, CVD, PVD, MBE, ion beam assisted deposition, ion beam deposition, and the like can be used separately or in conjunction with a sputtering process to introduce the REIs into the silicon oxide film during deposition.

Figure 3:
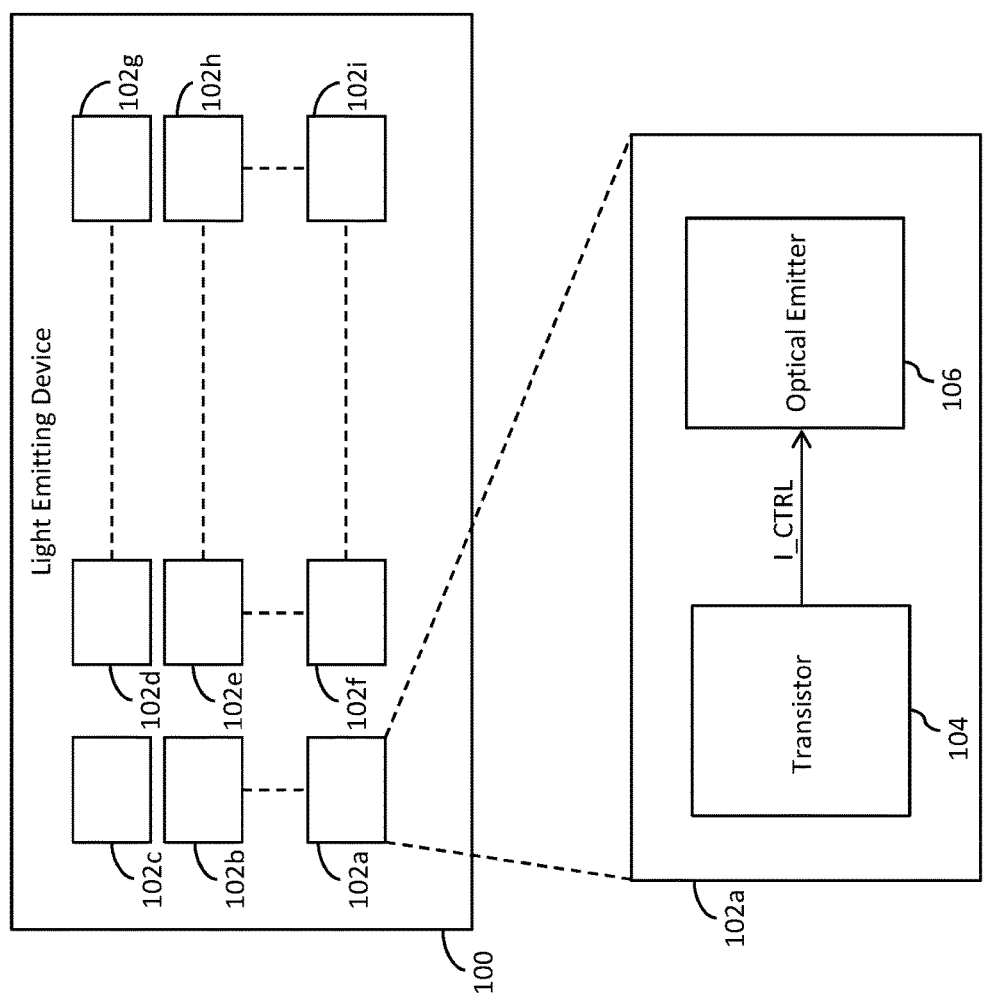
FIG. 3 is a schematic block diagram of a light emitting device, in accordance with an embodiment of the present invention.

Referring now to FIG. 3, a light emitting device 100 in accordance with an embodiment of the present invention is shown. The light emitting device 100 is used for displaying high-resolution images and video data having fast frame-rates. The light emitting device 100 may also be used as a scattering sensor, or as an interference sensor for sensor applications. The light emitting device 100 emits and absorbs light in multiple wavelength ranges.

The light emitting device 100 is a semiconductor device and includes a plurality of pixels of which first through ninth pixels 102a-102i are shown. The second through ninth pixels 102b-102i are structurally and functionally similar to the first pixel 102a. Each of the first through ninth pixels 102a-102i includes a transistor and at least one optical emitter. Thus, the first pixel 102a includes a first transistor 104. In an embodiment, the first pixel 102a further includes one optical emitter 106, i.e., the first optical emitter 106. Thus, the first pixel 102a includes the first transistor 104 and the first optical emitter 106. The first transistor 104 and the first optical emitter 106 are hereinafter referred to as a transistor 104 and an optical emitter 106, respectively. The transistor 104 is connected to a voltage source (not shown) for receiving a bias voltage. Based on the bias voltage, the transistor 104 generates a control current I_CTRL for controlling the emission of light from the optical emitter 106. It will be apparent to a person skilled in the art that the transistor and the optical emitter in each of the second through ninth pixels 102b-102i are structurally and functionally similar to the transistor 104 and the optical emitter 106 of the first pixel 102a, respectively. The functioning of the transistor 104 and the optical emitter 106 is explained in conjunction with FIGS. 5-9. It is to be understood that the transistor 104 can be one or more transistors configured to produce the control current I_CTRL for the optical emitter 106. It is also to be understood that the transistor 104 can be combined with one or more diode or diodes, one or more resistor or resistors, one or more capacitor or capacitors, and one or more transistor or transistors to produce the control current I_CTRL for the optical emitter 106.

Referring now to FIG. 4A, the first pixel 102a of the light emitting device 100 that includes the transistor 104 and the optical emitter 106 in accordance with an embodiment of the present invention is shown. In an embodiment, the optical emitter 106 includes a first vertical cavity surface emitting laser (VCSEL) 202. The first VCSEL 202 is connected to the transistor 104 for receiving the control current I_CTRL and emitting an optical signal at a first wavelength. In a preferred embodiment, the first wavelength has a wavelength of at least one of red, green, or blue light. Thus, the first VCSEL 202 emits at least one of red, green, or blue light at a time.

Referring now to FIG. 4B, the first pixel 102a of the light emitting device 100 that includes the transistor 104 and the optical emitter 106 in accordance with another embodiment of the present invention is shown. In the embodiment, the optical emitter 106 includes second through fourth VCSELs 204a-204c. The second through fourth VCSELs 204a-204c are connected to the transistor 104. Each of the second, third, and fourth VCSELs 204a, 204b, and 204c receive the control current I_CTRL from the transistor 104 and emit corresponding optical signals at specific wavelengths. In an example, the second, third, and fourth VCSELs 204a, 204b, and 204c emit optical signals at wavelengths that correspond to the wavelengths of red, blue, or green light, respectively.

Referring now to FIG. 4C, the first pixel 102a of the light emitting device 100 that includes the transistor 104 and the optical emitter 106 in accordance with yet another embodiment of the present invention is shown. In the embodiment, the optical emitter 106 includes a fifth VCSEL 206. The fifth VCSEL 206 is divided into first through third sections 206a-206c that are formed by dividing the fifth VCSEL 206 into three pie shaped sections. Each of the first through third sections 206a-206c subtends an angle of 120° at the center of the fifth VCSEL 206 to provide optical emissions preferably but not necessarily of equal intensity from the first through third sections 206a-206c. It will be apparent to a person skilled in the art that the first through third sections 206a-206c may subtend other angles at the center of the fifth VCSEL 206. The fifth VCSEL 206 receives the control current I_CTRL from the transistor 104. In a preferred embodiment, the first, second, and third sections 206a, 206b, and 206c emit red, green, and blue lights, respectively, based on the control current I_CTRL. The second through fifth VCSELs 204a-204c and 206 are structurally and functionally similar to the first VCSEL 202.

Figure 5A:
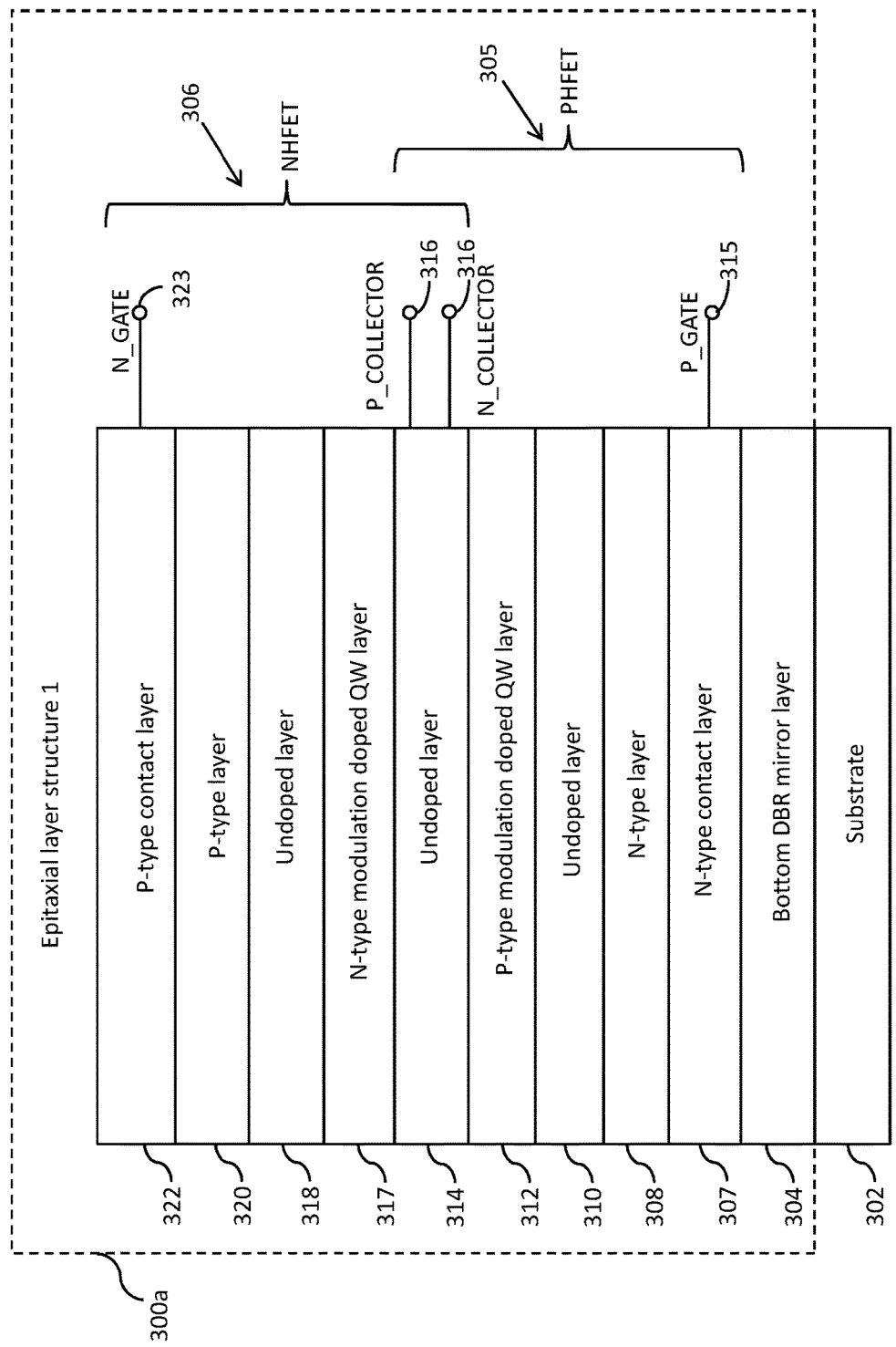
FIG. 5A is a cross sectional view of a first epitaxial layer structure that is used for manufacturing one or more transistors of the light emitting device of FIG. 3, in accordance with an embodiment of the present invention.

Referring now to FIG. 5A, a first epitaxial layer structure 300a formed over a substrate 302 that is used for manufacturing the transistor 104 in accordance with an embodiment of the present invention is shown. The substrate 302, in this embodiment, is a III-V substrate such as a semi-insulating gallium arsenide (GaAs) substrate. A bottom DBR mirror layer 304 is formed on the substrate 302. In an embodiment, the bottom DBR mirror layer 304 has an approximate thickness of 45000 Angstrom (Å). The bottom DBR mirror layer 304 may be formed on the substrate 302 using techniques such as CVD, MOCVD, ALD, NLD, sputtering, solgel, thermal evaporation, electron evaporation, MBE, and the like. It will be apparent to a person skilled in the art that any other suitable techniques may be used for forming the bottom DBR mirror layer 304 on the substrate 302.

Deposited on the bottom DBR mirror layer 304 is an active device layer structure which includes a p-channel heterostructure field effect transistor (PHFET) 305 and an n-channel NHFET 306. The p-channel PHFET 305 (comprising layers 307, 308, 310, 312, and 314) includes one or more p-type modulation doped quantum wells (QWs) and is positioned with a gate terminal 315 on the lower side (i.e., on the N-type contact layer 307) and a collector terminal 316 (P-collector or N-collector) on the upper side. The n-channel HFET 306 (comprising layers 314, 317, 318, 320, and 322) has one or more n-type modulation doped QWs and is positioned with a gate terminal 323 on the top side and a collector terminal 316 on the lower side which is the collector of the p-channel device. Therefore, in a preferred embodiment, a non-inverted N-channel device, i.e., the n-channel HFET 306 is stacked upon an inverted p-channel device, i.e., p-channel HFET 305, to form the active device layer structure.

The active device layer structure includes a heavily doped n-type contact layer(s) 307, an n-type layer 308, a first undoped layer 310, a p-type modulation doped QW layer structure 312, a second undoped layer 314, an n-type modulation doped QW layer structure 317, a third undoped layer 318, a p-type layer 320, and a heavily doped p-type contact layer 322. The first, second, and third undoped layers 310, 314, and 318 are spacer layers. The heavily doped n-type contact layer(s) 307 is formed using GaAs. The heavily doped n-type contact layer(s) 307 is heavily doped using N+ impurities (donor-type dopants). The heavy doping of the heavily doped n-type contact layer(s) 307 facilitates formation of ohmic contacts thereto. The heavily doped n-type contact layer(s) 307 has an approximate thickness of 2350 Å and a typical doping concentration of $3.5 \times 10^{18}$ cm$^{-3}$. The n-type layer 308 is formed on the heavily doped n-type contact layer(s) 307. The n-type layer 308 is formed using aluminum gallium arsenide (AlGaAs). The n-type layer 308 has a doping concentration that is less than the doping concentration of the heavily doped n-type contact layer(s) 307. The n-type layer 308 has a typical thickness of 700 Å. The n-type layer 308 is made sufficiently thin to enable current tunneling therethrough during operation of optoelectronic/electronic devices realized from the active device layer structure. The thickness of the n-type layer 308 may be adjusted to set the desired current gain of a p-type quantum-well-base bipolar transistor realized from this structure as described below. Preferably, the doping of the n-type layer 308 is such that it should not be depleted in any range of operation of devices formed using the first epitaxial layer structure 300a, i.e., the total doping in the n-type layer 308 should exceed the total doping charge contained in the p-type modulation doped QW layer structure 312. In the preferred embodiment of the first epitaxial layer structure 300a, the heavily doped n-type contact layer(s) 307 achieves low contact resistance and the n-type layer 308 defines the capacitance of the p-channel HFET 305 with respect to the p-type modulation doped QW layer structure 312. The n-type layer 308 also serves optically as a small part of a lower waveguide cladding for optical devices realized using the active device layer structure. A majority of the lower waveguide cladding is provided by the bottom DBR mirror layer 304 itself.

The first undoped layer 310 is formed on the n-type layer 308. The first undoped layer 310 is formed using AlGaAs. The first undoped layer 310 has a typical thickness of 300 Å. The first undoped layer 310 preferably includes a thin first undoped capping layer (not shown) and a first undoped spacer layer (not shown). The first undoped capping layer serves to prevent oxidation of the n-type layer 308 during subsequent manufacturing operations.

The p-type modulation doped QW layer structure 312 is formed on the first undoped layer 310. The p-type modulation doped QW layer structure 312 defines one or more p-type modulation doped QWs that may be formed from strained or unstrained heterojunction materials. The p-type modulation doped QW layer structure 312 includes one or more p-type GaAs barrier layers (not shown) that are doped with a p-type impurity. The p-type modulation doped QW layer structure 312 has a typical thickness of 25 Å. The second undoped layer 314 is formed on the p-type modulation doped QW layer structure 312. The second undoped layer 314 is formed using AlGaAs and has a typical thickness of 6100 Å. The second undoped layer 314 includes a second undoped spacer layer (not shown) and/or a second undoped capping layer (not shown).

The n-type modulation doped QW layer structure 317 is formed on the second undoped layer 314. The n-type modulation doped QW layer structure 317 may include alternating layers of one or more n-type modulation doped QWs that may be formed from strained or unstrained heterojunction materials. The n-type modulation doped QW layer structure 317 includes one or more n-type barrier layers (not shown) which are fabricated using GaAs which are doped with an n-type impurity. The n-type modulation doped QW layer structure 317 has a typical thickness of 80 Å. The third undoped layer 318 is formed on the n-type modulation doped QW layer structure 317. The third undoped layer 318 is formed using AlGaAs. The third undoped layer 318 has a thickness of 300 Å. The third undoped layer 318 includes a third undoped spacer layer (not shown) and/or a third undoped capping layer (not shown).

The p-type layer 320 is formed on the third undoped layer 318. The p-type layer 320 is formed using GaAs. The p-type layer 320 is further doped with a p-type impurity. The p-type layer 320 has a typical thickness of 1200 Å. The thickness of the p-type layer 320 may be adjusted to set the desired current gain of an n-type quantum-well-base transistor realized from the active device layer structure. The total doping of the p-type layer 320 exceeds the total charge contained in the n-type modulation doped QW layer structure 317. The p-type layer 320 serves as an etch stop layer when forming contacts to the n-type inversion channel(s) of the n-channel HFET 306. The p-type layer 320 is also made sufficiently thin to enable current tunneling therethrough during operation of optoelectronic/electronic devices realized from the active device layer structure. The p-type layer 320 also serves optically as a small part of the upper waveguide cladding for optical devices realized through this structure. The heavily doped p-type contact layer 322 is formed on the p-type layer 320. The heavily doped p-type contact layer 322 is heavily doped with p-type impurities (acceptor-type dopants) and hence facilitates formation of ohmic contacts thereto. The heavily doped p-type contact layer 322 is formed using GaAs. The heavily doped p-type contact layer 322 has a typical doping concentration of $1 \times 10^{20}$ cm$^{-3}$. Further, the heavily doped p-type contact layer 322 has a typical thickness of 600 Å.

Figure 5B:
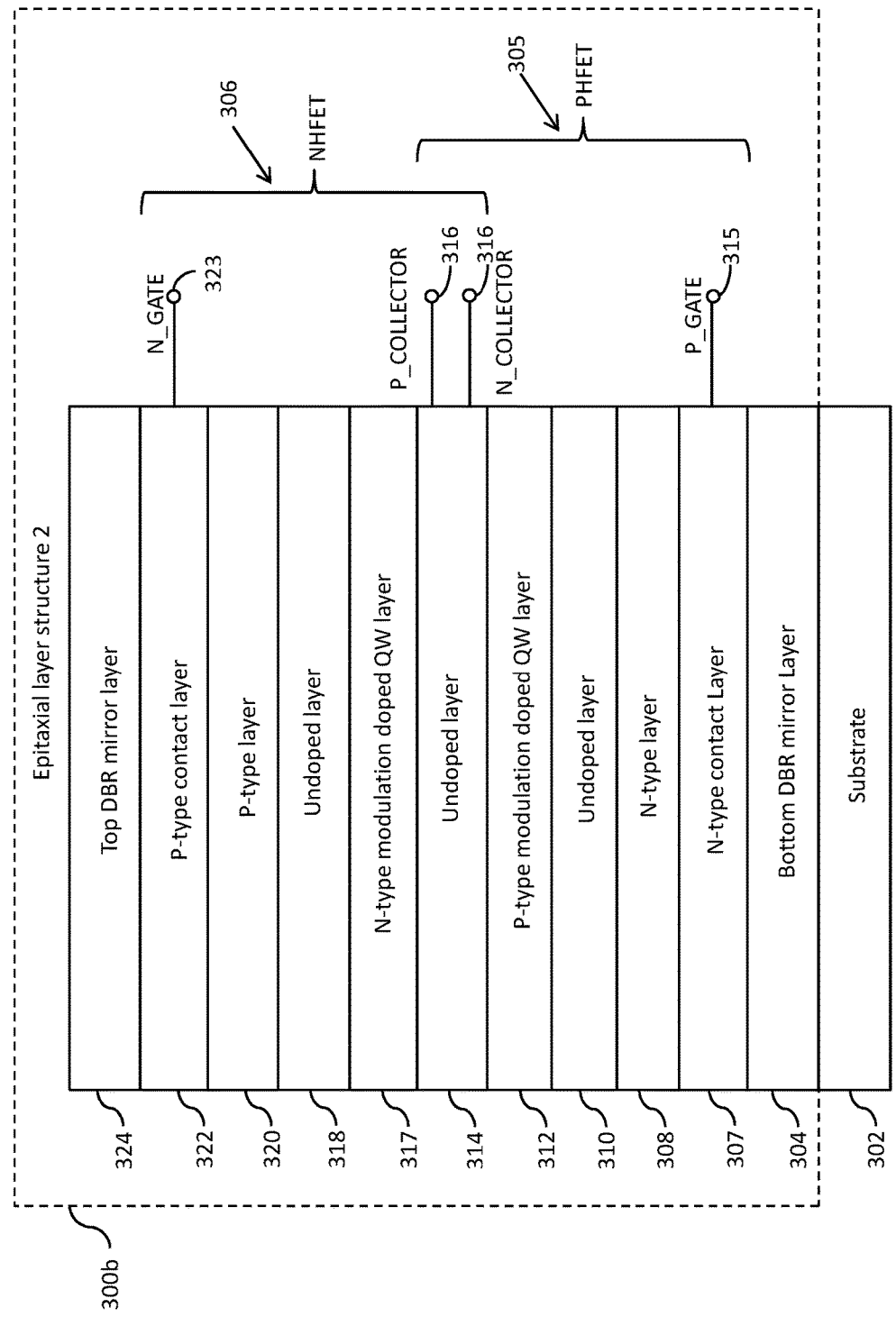
FIG. 5B is a cross sectional view of a second epitaxial layer structure that includes a top distributed Bragg reflector (DBR) mirror layer which is formed on the first epitaxial layer structure of FIG. 5A, in accordance with an embodiment of the present invention.

Referring now to FIG. 5B, a second epitaxial layer structure 300b that includes a top DBR mirror layer 324 which is formed on the first epitaxial layer structure 300a of FIG. 5A, in accordance with an embodiment of the present invention is shown. The bottom DBR mirror layer 304 of the second epitaxial layer structure 300b may be implemented as one of the DBR mirror layer structure 30, 50, or 70 and is explained in detail in conjunction with FIGS. 2A-2C. The top DBR mirror layer 324 is grown epitaxially on the first epitaxial layer structure 300a. The top and bottom DBR mirror layers 324 and 304 are explained in detail in conjunction with FIGS. 2A-2C. The first through fifth VCSELs 202, 204a-204c, and 206 are realized using the second epitaxial layer structure 300b. In an embodiment, the top DBR mirror layer 324 is structurally and functionally similar to the bottom DBR mirror layer 304.

Figure 6:
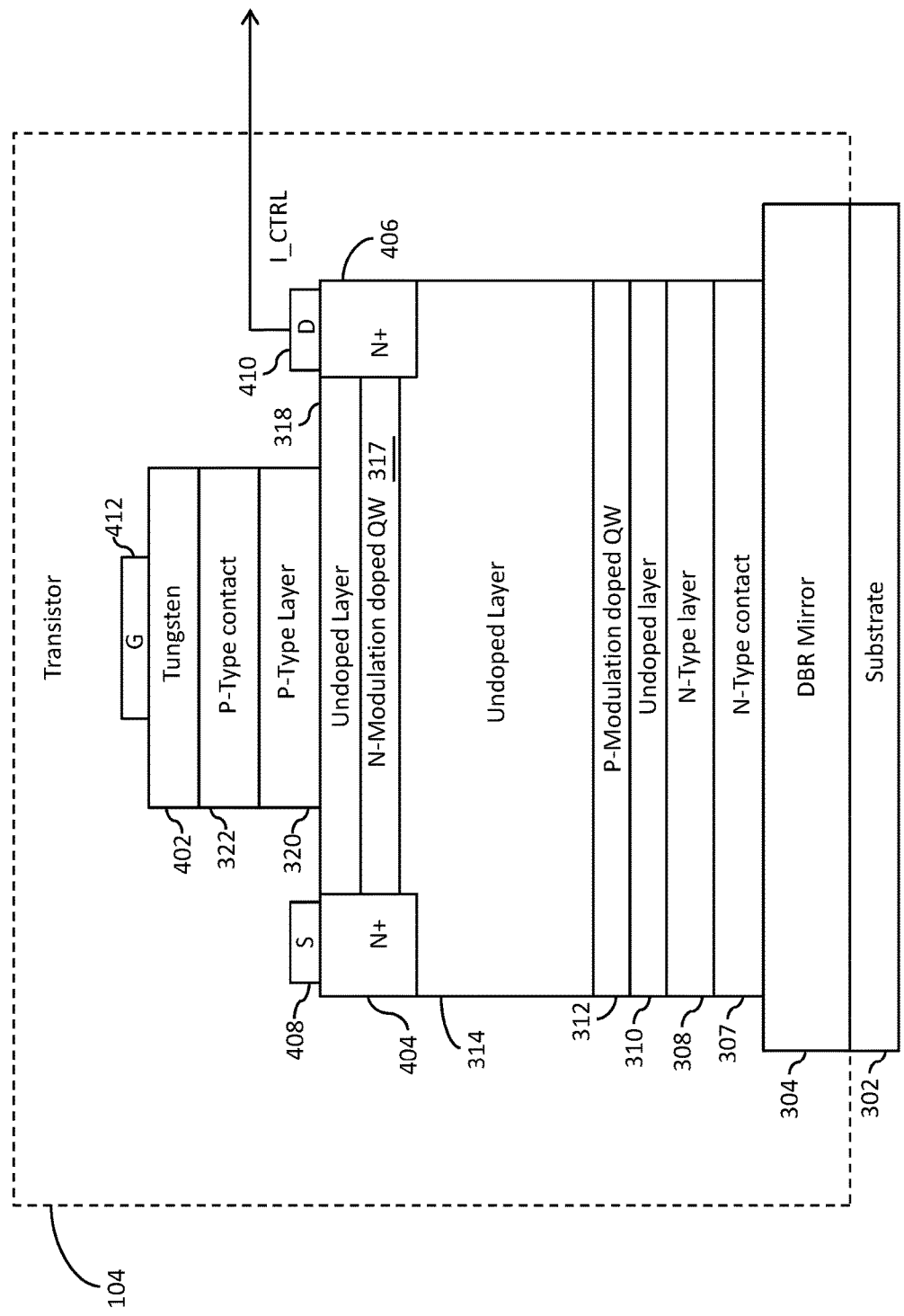
FIG. 6 is a cross sectional view of a transistor that is formed by the first epitaxial layer structure of FIG. 5A, in accordance with an embodiment of the present invention.

Referring now to FIG. 6, a cross sectional view of the transistor 104, in accordance with an embodiment of the present invention is shown. In an embodiment, the transistor 104 is a high electron mobility transistor (HEMT) 104. The transistor 104 is realized from the first epitaxial layer structure 300a. The HEMT 104 is formed by the stacked n-channel HFET 306 and the p-channel HFET 305. The transistor 104 includes a first tungsten layer 402 formed on the heavily doped p-type contact layer 322 to form an ohmic contact. A first etching operation is performed into the first epitaxial layer structure 300a down to the third undoped layer 318 to form first and second intermediate mesas. During the first etching operation, a chlorine-based gas mixture that includes fluorine is used as an etchant to etch down to the third undoped layer 318. Then first and second N+ ion implants are formed into first and second N+ ion implanted regions 404 and 406 by patterning using photolithography to form contacts to the n-type modulation doped QW layer structure 317. During this operation, a masking step is performed to expose portions of the first and second intermediate mesas. Then the first and second intermediate mesas are subjected to the first and second N+ ion implants to form the first and second N+ ion implanted regions 404 and 406, which are in electrical contact with the n-type modulation doped QW layer structure 317. The first and second N+ ion implanted regions 404 and 406 extend down into the second undoped layer 314. A rapid thermal anneal (RTA) of the order of 900° C. or greater is performed to activate the first and second N+ ion implants in the first and second N+ ion implanted regions 404 and 406. A source terminal 408 is formed on the first intermediate mesa and in contact with the first N+ ion implanted region 404. A drain terminal 410 is formed on the second intermediate mesa and in contact with the second N+ ion implanted region 406. The source and drain terminals 408 and 410 are deposited preferably via a lift-off process. Further, a gate terminal 412 is deposited on the first tungsten layer 402. The source, drain, and gate terminals 408, 410, and 412 are preferably formed from a gold (Au) alloy including germanium (Ge) or nickel (Ni) such as AuGe/Ni. The transistor 104 outputs the control current I_CTRL at the drain terminal 410 based on the biasing voltages between the source and gate terminals 408 and 412 and the gate and drain terminals 412 and 410.

Figure 7:
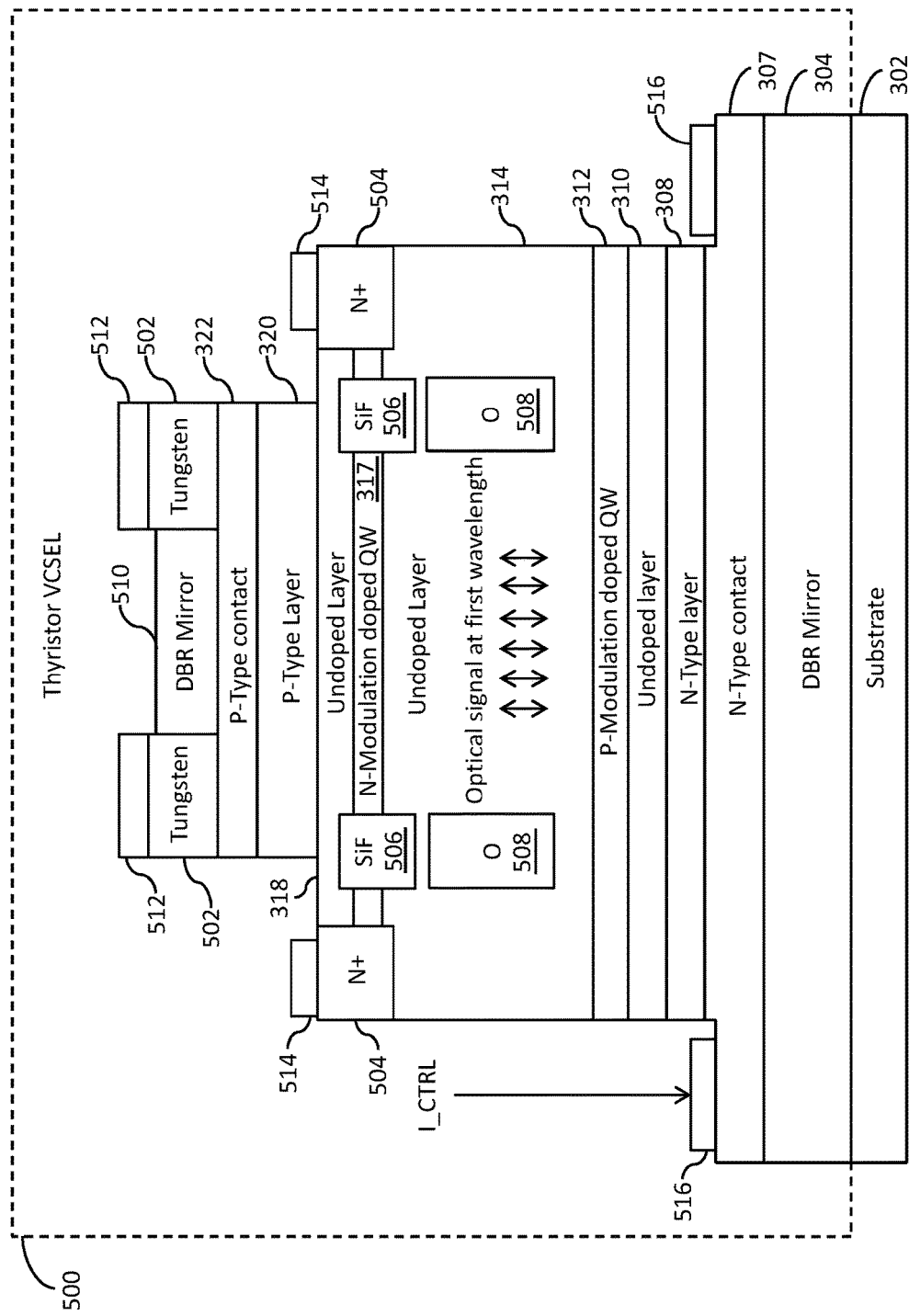
FIG. 7 is a cross sectional view of a vertical cavity surface emitting laser (VCSEL) of the light emitting device of FIG. 3, in accordance with an embodiment of the present invention.

Referring now to FIG. 7, a cross sectional view of the first VCSEL 202 that operates as a thyristor VCSEL 500, in accordance with an embodiment of the present invention is shown. The first VCSEL 202 is realized from the second epitaxial layer structure 300b. The first VCSEL 202 includes a second tungsten layer 502, a third N+ ion implanted region 504, a Silicon Fluoride (SiF) ion implanted region 506, an oxygen ion implanted region 508, a first top DBR mirror 510, a first anode terminal 512, a first injector terminal 514, and a first cathode terminal 516 that are formed on the second epitaxial layer structure 300b. The top DBR mirror layer 324 is patterned and etched to expose the heavily doped p-type contact layer 322 upon which the second tungsten layer 502 is formed to provide an ohmic contact. A third etching operation is then performed into the second tungsten layer 502 down to the heavily doped p-type contact layer 322 for forming a first circular mesa. A fourth etching operation is performed into the second epitaxial layer structure 300b down to the third undoped layer 318 for forming a first annular mesa. During the fourth etching operation, a chlorine-based gas mixture that includes fluorine is typically used as an etchant to etch down to the third undoped layer 318. Then a third N+ ion implant is formed into the third N+ ion implanted region 504 by a patterning process using photolithography to form contacts to the n-type modulation doped QW layer structure 317. In this process, a masking step is typically performed to expose a portion of the first annular mesa. Then the first annular mesa is subjected to the third N+ ion implant to produce the third N+ ion implanted region 504, which is in electrical contact with the n-type modulation doped QW layer structure 317. SiF is implanted in a first portion of the second undoped layer 314, the n-type modulation doped QW layer structure 317, and the third undoped layer 318 to produce the SiF ion implanted region 506. The SiF ion implanted region 506 is annular in shape, encompasses a portion of the n-type modulation doped QW layer structure 317, and extends into the second and third undoped layers 314 and 318. An oxygen ion implant is further implanted into a second portion of the second undoped layer 318 to form the oxygen ion implanted region 508. The oxygen ion implanted region 508 is typically annular in shape. The oxygen ion implanted region 508 is formed below the SiF ion implanted region 506 in the second undoped layer 314.

A fifth etching operation is performed into the second epitaxial layer structure 300b down to the heavily doped n-type contact layer(s) 307 to form a second annular mesa. The first VCSEL 202 is further subjected to a rapid thermal anneal (RTA) of the order of 900° C. or greater to activate the third N+ ion implanted region 504 and the SiF ion and oxygen ion implanted regions 506 and 508, respectively. The first VCSEL 202 is oxidized in a steam ambient to form the first top DBR mirror 510 in the first circular mesa. The first top DBR mirror 510 may be one of the top DBR mirror structures 30, 50, or 70. In an embodiment, REIs are incorporated into the first top DBR mirror 510 for facilitating photon up or down-conversion. Photon up-conversion is a process of sequentially absorbing two or more incident photons by nanoparticles, leading to emission of light at a wavelength shorter than the wavelengths of the incident photons. Photon down-conversion is a process of absorbing an incident photon by nanoparticles, leading to emission of two or more photons at wavelengths longer than the wavelength of the incident photon. The nanoparticles may include lanthanide doped nanoparticles and semiconductor nanoparticles. The REIs may be one of lanthanide ions such as Erbium ($Er^{3+}$), Ytterbium ($Yb^{3+}$), Thulium ($Tm^{3+}$), Cesium ($Ce^{3+}$), Terbium ($Tb^{4+}$) ions, and the like. The incorporation of the REIs in the top DBR mirror structures 30, 50, and 70 is explained in detail in FIGS. 2A-2C.

The first anode terminal 512 is formed on the second tungsten layer 502. The first injector terminal 514 is deposited on the first annular mesa, and is in contact with the third N+ ion implanted region 504. The first injector terminal 514 is hence electrically coupled to the n-type modulation doped QW layer structure 317 by way of the third N+ ion implanted region 504. The first cathode terminal 516 is formed on the second annular mesa and in contact with the heavily doped n-type contact layer(s) 307. The first injector and first cathode terminals 514 and 516 are deposited preferably via a lift-off process. The first anode, first injector, and first cathode terminals 512, 514, and 516 are preferably formed from an Au alloy metal such as AuGe/Ni/Au. The SiF ion and oxygen ion implanted regions 506 and 508 act as a barrier to lateral current flow to funnel the current flowing between the first anode and first cathode terminals 512 and 516 towards the center of an active region of the first VCSEL 202. The heavily doped n-type contact layer(s) 307, the n-type layer 308, the first undoped layer 310, the p-type modulation doped QW layer structure 312, the second undoped layer 314, the n-type modulation doped QW layer structure 317, the third undoped layer 318, the p-type layer 320, and the heavily doped p-type contact layer 322 form the active region of the first VCSEL 202. As the second through fifth VCSELs 204a-204c, and 206 are structurally and functionally similar to the first VCSEL 202, thus the second through fifth VCSELs 204a-204c, and 206 may also operate as the thyristor VCSEL 500.

In the operation of the first VCSEL 202 as a thyristor laser, the first anode terminal 512 is forward biased with respect to the first cathode terminal 516. A bias voltage between the first anode and first cathode terminals 512 and 516 that is sufficiently high causes the first VCSEL 202 to operate in a forward conducting mode. In the forward conducting mode of operation, electrons from the first anode terminal 512 populate the active region of the thyristor VCSEL 500 simultaneously with holes injected from the first cathode terminal 516. Hence, lasing takes place in the form of a vertical cavity thyristor laser, and the optical signal at the first wavelength is emitted. The heavily doped n-type contact layer(s) 307, the n-type layer 308, the first undoped layer 310, the p-type modulation doped QW layer structure 312, the second undoped layer 314, the n-type modulation doped QW layer structure 317, the third undoped layer 318, the p-type layer 320, and the heavily doped p-type contact layer 322 between the bottom DBR mirror layer 304 and the first top DBR mirror 510 form a resonant cavity of the first VCSEL 202. The first top DBR mirror 510 forms an optical aperture over the resonant cavity.

The drain terminal 410 of the transistor 104 is connected to the first cathode terminal 516 of the first VCSEL 202. Based on the biasing between the source and gate terminals 408 and 412, and the gate and drain terminals 412 and 410, the transistor 104 generates the control current I_CTRL. The drain terminal 410 of the transistor 104 outputs the control current I_CTRL to the first cathode terminal 516 of the first VCSEL 202. The first VCSEL 202 receives the control current I_CTRL and emits the optical signal at the first wavelength, i.e., the active region of the first VCSEL 202 emit the optical signal at the first wavelength. In an embodiment, the SiF ion and oxygen ion implanted regions 506 and 508 direct the optical signal generated by the n-type and p-type modulation doped QW layer structures 312 and 317 to the first top DBR mirror 510. The SiF ion and oxygen ion implanted regions 506 and 508 further confine the optical signal in the resonant cavity and prevent the optical signal from escaping through the sidewalls of the first VCSEL 202. The REIs in the first top DBR mirror 510 receive the optical signal at the first wavelength and perform at least one of a photon up-conversion or photon down-conversion process on the optical signal to generate an optical signal at a second wavelength. In the embodiment, the first wavelength is higher than the second wavelength. In an example, the optical signal at the first wavelength is infrared light and the optical signal at the second wavelength is visible light. The visible light includes at least one of red, blue, and green lights when the first top DBR mirror 510 includes $Er^{3+}$, $Tm^{3+}$, and $Ym^{3+}$ ions, respectively, as the REIs therein. Thus, when the first top DBR mirror 510 is incorporated with one of the $Er^{3+}$, $Tm^{3+}$, and $Ym^{3+}$ ions, the first VCSEL 202 emits one of red, blue, and green lights corresponding to the $Er^{3+}$, $Tm^{3+}$, and $Ym^{3+}$ ions, respectively. In another embodiment, the first top DBR mirror 510 is divided into fourth through sixth pie-shaped sections in a manner similar to the fifth VCSEL 206. In one example, the fourth pie-shaped section is incorporated with $Er^{3+}$ ions. Hence, the fourth pie-shaped section emits red light. The fifth pie-shaped section is incorporated with $Tm^{3+}$ ions. Hence, the fifth pie-shaped section emits blue light. The sixth pie-shaped section is incorporated with $Ym^{3+}$ ions. Hence, the sixth pie-shaped section emits green light. In yet another embodiment, the first wavelength is lower than the second wavelength. In an example, the optical signal at the first wavelength is visible light and the optical signal at the second wavelength is infrared light. Hence, the first top DBR mirror 510 includes one or more of $Er^{3+}$, $Ce^{3+}$, $Yb^{3+}$, and $Tb^{4+}$ ions, respectively, as the REIs therein. The first top DBR mirror 510 receives the optical signal at the first wavelength as light in the visible range, which is incident on the REIs. The REIs perform photon down-conversion to generate infrared light. It will be apparent to a person skilled in the art that the REIs can include various other REIs apart from $Er^{3+}$, $Tm^{3+}$, and $Ym^{3+}$ ions. It will further be apparent to a person skilled in the art that the REIs may vary based on the application of the light emitting device 100. It will also be understood by those of skilled in the art that the light emitting device 100 may emit light at various other wavelengths apart from the wavelengths of red, green, and blue lights.

In yet another embodiment, the REIs are incorporated into the bottom DBR mirror layer 304. In this embodiment, the first VCSEL 202 is configured as a bottom emitting VCSEL. The substrate 302 is made from GaAs and is transparent. Hence, the bottom DBR mirror layer 304 receives the optical signal at the first wavelength, performs photon up-conversion or down-conversion, and outputs the optical signal at the second wavelength. It will be apparent to a person skilled in the art that the bottom DBR mirror layer 304 performs photon up-conversion or down-conversion in a manner similar to the first top DBR mirror 510 as described in the aforementioned specification. In yet another embodiment, the REIs are incorporated in both the first top DBR mirror 510 and the bottom DBR mirror layer 304.

Figure 8:
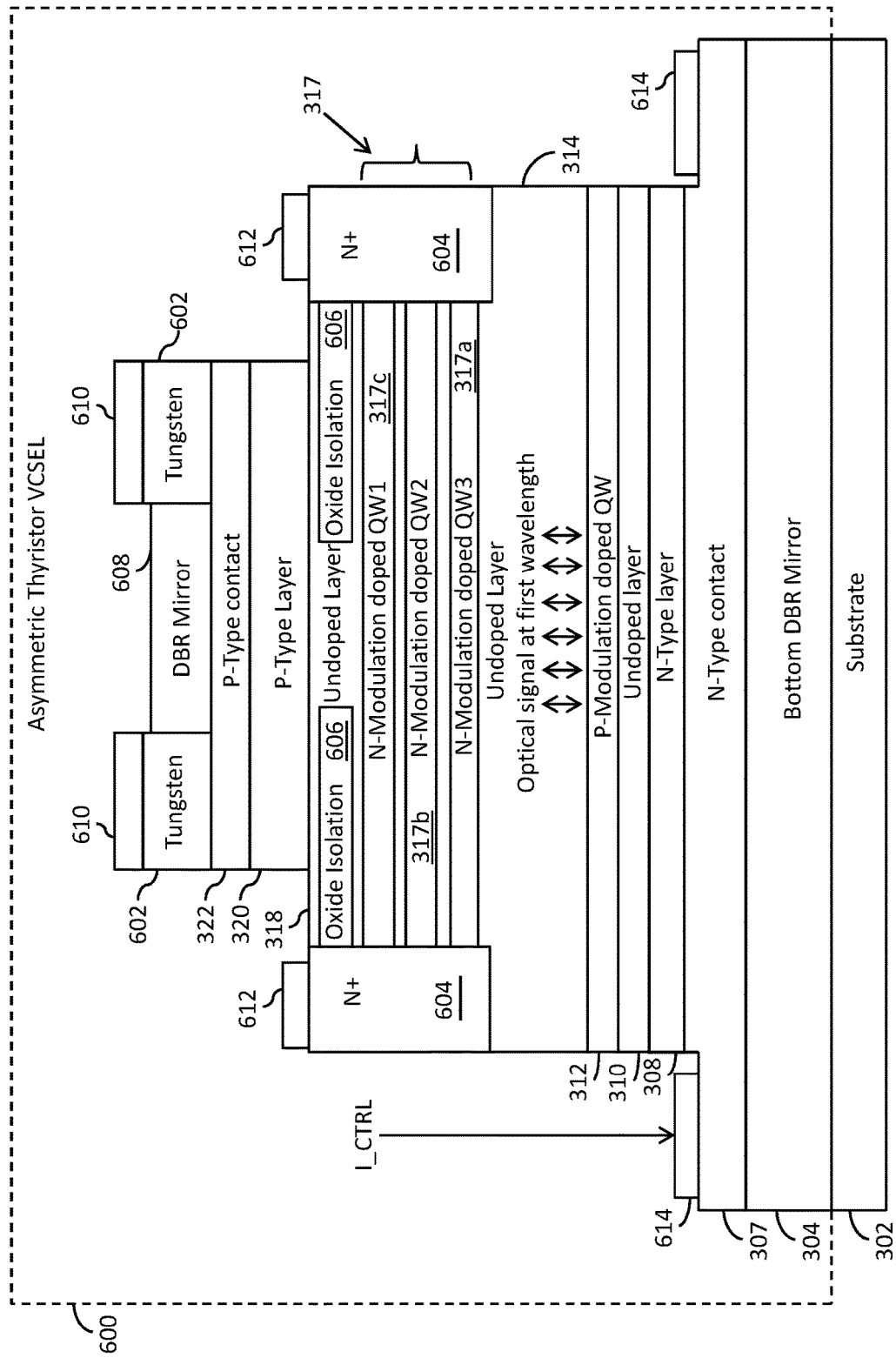
FIG. 8 is a cross sectional view of the VCSEL of the light emitting device of FIG. 3, in accordance with another embodiment of the present invention.

Referring now to FIG. 8, a cross sectional view of the first VCSEL 202 that operates as an asymmetric thyristor VCSEL 600, in accordance with another embodiment of the present invention is shown. The asymmetric thyristor VCSEL 600 is realized using the second epitaxial layer structure 300b. In the embodiment, the optical emitter 106 is realized as the asymmetric thyristor VCSEL 600. The asymmetric thyristor VCSEL 600 includes a third tungsten layer 602, a fourth N+ ion implanted region 604, a first oxide isolation layer 606, a second top DBR mirror 608, a second anode terminal 610, a second injector terminal 612, and a second cathode terminal 614 that are formed on the second epitaxial layer structure 300b. The top DBR mirror layer 324 is patterned and etched to expose the heavily doped p-type contact layer 322 upon which the third tungsten layer 602 is deposited to produce an ohmic contact. The n-type modulation doped QW layer structure 317 of the asymmetric thyristor VCSEL 600 includes first through third n-type modulation doped QWs 317a-317c. A sixth etching operation is performed into the third tungsten layer 602 down to the heavily doped p-type contact layer 322 for forming a second circular mesa. A seventh etching operation is performed into the second epitaxial layer structure 300b down to the third undoped layer 318 for forming a third annular mesa. During the seventh etching operation, a chlorine-based gas mixture that includes fluorine, for example, in a plasma etching environment is used as an etchant to etch down to the third undoped layer 318. Then, a fourth N+ ion implant is performed to produce the fourth N+ ion implanted region 604 and is subsequently patterned using photolithography, for example, to form contacts to the n-type modulation doped QW layer structure 317. In this process, a masking step is typically performed to expose a portion of the third annular mesa. Then the third annular mesa is subjected to the fourth N+ ion implant to produce the fourth N+ ion implanted region 604, which is in electrical contact with the n-type modulation doped QW layer structure 317.

An eighth etching operation is performed into the second epitaxial layer structure 300b down to the heavily doped n-type contact layer(s) 307 to form a fourth annular mesa. The asymmetric thyristor VCSEL 600 is further subjected to a rapid thermal anneal (RTA) of the order of 900° C. or greater to activate the fourth N+ ion implanted region 604. Lateral oxidation of a first portion of the third undoped layer 318 is performed for creating the first oxide isolation layer 606. The asymmetric thyristor VCSEL 600 is oxidized in a steam ambient to form the second top DBR mirror 608 in the second circular mesa. The second top DBR mirror 608 may be one of the top DBR mirror structures 30, 50, or 70. In an embodiment, the second top DBR mirror 608 further includes the REIs therein for facilitating at least one of photon up-conversion or down-conversion.

The second anode terminal 610 is formed on the third tungsten layer 602. The second injector terminal 612 is deposited on the third annular mesa and is in contact with the fourth N+ ion implanted region 604. The second injector terminal 612 is hence electrically coupled to the first through third n-type modulation doped QW layer structures 317a-317c by way of the fourth N+ ion implanted region 604. The second cathode terminal 614 is formed on the fourth annular mesa and in contact with the heavily doped n-type contact layer(s) 307 to form an ohmic contact. The second injector terminal 612 and the second cathode terminal 614 are deposited and patterned preferably via a lift-off process. The second anode, second injector, and second cathode terminals 610, 612, and 614 are preferably formed from an Au alloy metal such as AuGe/Ni/Au. The first oxide isolation layer 606 acts as a barrier to current flow so as to funnel the current flowing between the second anode terminal 610 and the second cathode terminal 614 towards the center of the active region of the asymmetric thyristor VCSEL 600. The heavily doped n-type contact layer(s) 307, the n-type layer 308, the first undoped layer 310, the p-type modulation doped QW layer structure 312, the second undoped layer 314, the n-type modulation doped QW layer structure 317, the third undoped layer 318, the p-type layer 320, and the heavily doped p-type contact layer 322 form the active region of the asymmetric thyristor VCSEL 600. As the second through fifth VCSELs 204a-204c, and 206 are structurally and functionally similar to the first VCSEL 202, thus the second through fifth VCSELs 204a-204c, and 206 may also operate as the asymmetric thyristor VCSEL 600.

The drain terminal 410 of the transistor 104 is connected to the second cathode terminal 614 of the asymmetric thyristor VCSEL 600. Based on the biasing between the source and gate terminals 408 and 412, and the gate and drain terminals 412 and 410, the transistor 104 generates the control current I_CTRL. The drain terminal 410 of the transistor 104 outputs the control current I_CTRL to the second cathode terminal 614 of the asymmetric thyristor VCSEL 600. The asymmetric thyristor VCSEL 600 receives the control current I_CTRL. The p-type modulation doped QW layer structure 312 and the n-type modulation doped QW layer structure 317 of the asymmetric thyristor VCSEL 600 generate the optical signal at the second wavelength based on the control current I_CTRL. The first oxide isolation layer 606 guides the optical signal generated by the p-type and n-type modulation doped QW layer structures 312 and 317. The optical signal at the first wavelength is incident on the REIs incorporated in the second top DBR mirror 608. In an embodiment, the optical signal at the first wavelength is infrared light. Thus, upon photon up-conversion of the infrared light by the REIs, the asymmetric thyristor VCSEL 600 emits the optical signal at the second wavelength, i.e., visible light. The visible light includes at least one of red, blue, and green lights corresponding to the $Er^{3+}$, $Tm^{3+}$ and the $Yb^{3+}$ ions, respectively. In an example, the second top DBR mirror 608 is incorporated with one of the $Er^{3+}$, $Tm^{3+}$, and $Ym^{3+}$ ions. Hence, the asymmetric thyristor VCSEL 600 emits one of the red, blue, and green lights corresponding to the $Er^{3+}$, $Tm^{3+}$, and $Ym^{3+}$ ions, respectively. In another embodiment, the second top DBR mirror 608 is divided into the seventh through ninth pie-shaped sections in a manner similar to the fifth VCSEL 206. In one example, the seventh pie-shaped section is incorporated with $Er^{3+}$ ions. Hence, the seventh pie-shaped section emits red light. The eighth pie-shaped section is incorporated with $Tm^{3+}$ ions. Hence, the eighth pie-shaped section emits blue light. The ninth pie-shaped section is incorporated with $Ym^{3+}$ ions. Hence, the ninth pie-shaped section emits green light. In yet another embodiment, the optical signal at the first wavelength is visible light and the second top DBR mirror 608 includes REIs for photon down-conversion. Thus, upon photon down-conversion of the visible light by the REIs in the second top DBR mirror 608, the asymmetric thyristor VCSEL 600 emits the infrared light. It will be apparent to a person skilled in the art that the second top DBR mirror 608 performs down-conversion of the optical signal at the first wavelength in a manner similar to the photon down-conversion by the REIs in the first top DBR mirror 510 as described in FIG. 7. In yet another embodiment, the bottom DBR mirror layer 304 is incorporated with the REIs therein. Since the substrate 302 is made from GaAs and is transparent, the asymmetric thyristor VCSEL 600 emits the optical signal at the second wavelength through the substrate 302. It will be apparent to a person skilled in the art that the bottom DBR mirror layer 304 performs photon up-conversion or down-conversion in a manner similar to the second top DBR mirror 608 as described in the aforementioned specification. In yet another embodiment, the REIs are incorporated in both the second top DBR mirror and bottom DBR mirror layer 608 and 304.

Figure 9:
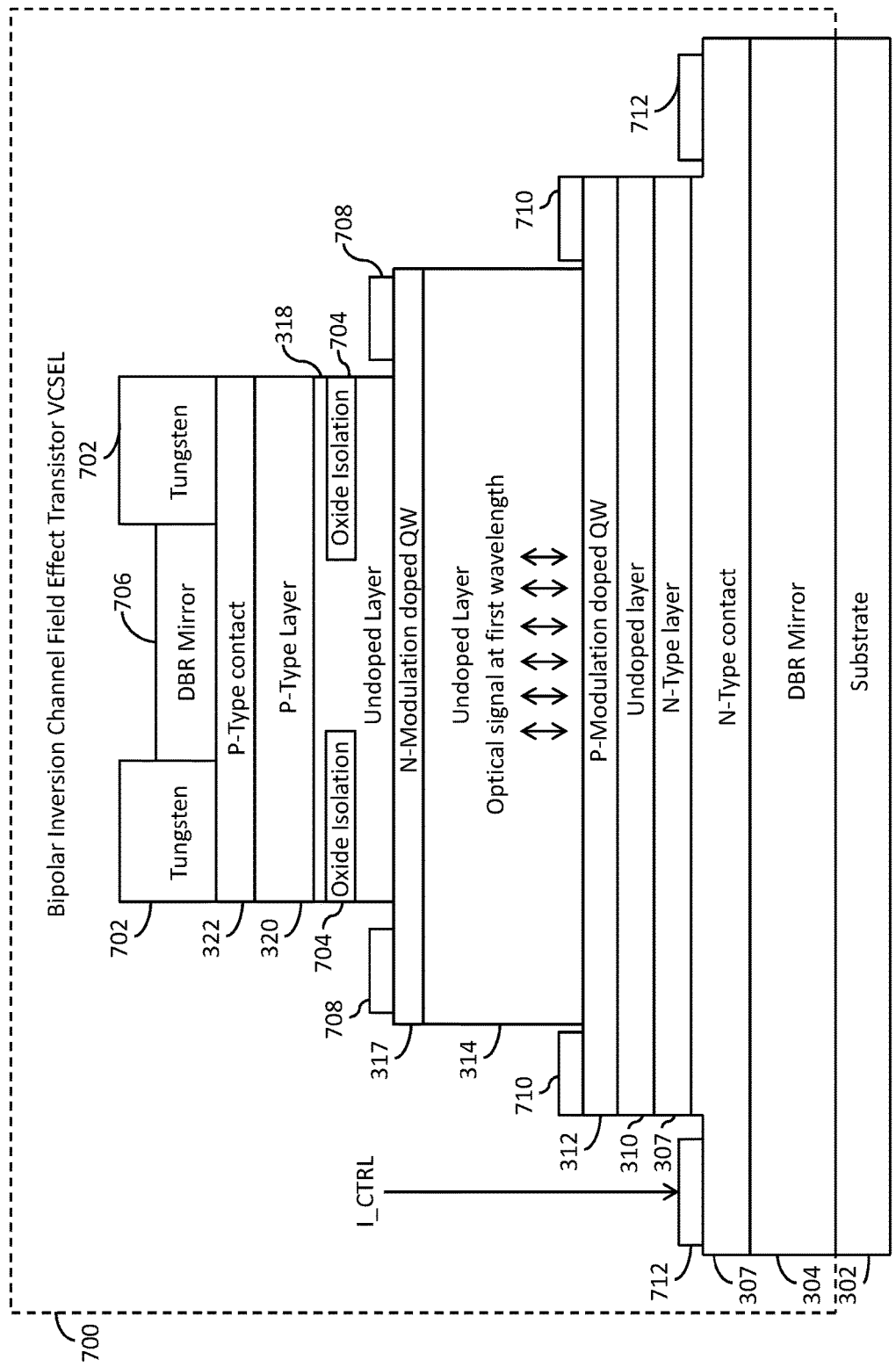
FIG. 9 is a cross sectional view of the VCSEL of the light emitting device of FIG. 3, in accordance with yet another embodiment of the present invention.

Referring now to FIG. 9, a cross sectional view of the first VCSEL 202 that operates as a bipolar inversion channel field effect transistor (BICFET) VCSEL 700 with oxide isolation, in accordance with yet another embodiment of the present invention is shown. The BICFET VCSEL 700 is realized using the second epitaxial layer structure 300b. In the embodiment, the optical emitter 106 includes the BICFET VCSEL 700. The top DBR mirror layer 324 is patterned and etched to expose the heavily doped p-type contact layer 322 upon which a fourth tungsten layer 702 is deposited to form an ohmic contact. A ninth etching operation is performed into the fourth tungsten layer 702 down to the top DBR mirror layer 324 to form a third circular mesa. A tenth etching operation is performed into the second epitaxial layer structure 300b down to the n-type modulation doped QW layer structure 317 for forming a fifth annular mesa.

During the tenth etching operation, a chlorine-based gas mixture that includes fluorine in a plasma etching module is used, for example, to etch down to the n-type modulation doped QW layer structure 317. Lateral oxidation of the first portion of the third undoped layer 318 is performed for creating a second oxide isolation layer 704.

An eleventh etching operation is performed into the second epitaxial layer structure 300b down to the p-type modulation doped QW layer structure 312. A sixth annular mesa is formed on the p-type modulation doped QW layer structure 312 as a result of the eleventh etching process. A twelfth etching operation is performed into the second epitaxial layer structure 300b down to the heavily doped n-type contact layer(s) 307 to form a seventh annular mesa. The BICFET VCSEL 700 is oxidized in a steam ambient to form a third top DBR mirror 706 in the third circular mesa. The third top DBR mirror 706 may be one of the top DBR mirror structures 30, 50, or 70. In an embodiment, the REIs are incorporated into the third top DBR mirror 706. A collector terminal 708 is formed on the fifth annular mesa and in contact with the n-type modulation doped QW layer structure 317. The collector terminal 708 is hence electrically coupled to the n-type modulation doped QW layer structure 317. A base terminal 710 is deposited on the sixth annular mesa, and is in contact with the p-type modulation doped QW layer structure 312. The base terminal 710 is hence electrically coupled to the p-type modulation doped QW layer structure 312. An emitter terminal 712 is formed on the seventh annular mesa and in contact with the heavily doped n-type contact layer(s) 307. The collector, base, and emitter terminals 708, 710, and 712 are deposited and patterned preferably using a lift-off process. The collector, base, and emitter terminals 708, 710, and 712 are preferably formed from an Au alloy metal such as AuGe/Ni/Au.

The aforementioned BICFET VCSEL 700 is configured to function as a p-channel BICFET. The p-channel BICFET is a bipolar junction transistor. Hence, the collector and emitter terminals 708 and 712 are n-type terminals. Further, the base terminal 710 is a p-type terminal. The p-channel BICFET can be operated in an active mode by applying a forward bias to the PN junction of the emitter and base terminals 712 and 710 while applying a reverse bias to the PN junction of the base and collector terminals 710 and 708. This causes electrons to be injected from the emitter terminal 712 to the collector terminal 708. Since electrons are negative carriers, their injection contributes to current flowing into the collector terminal 708 and current flowing out of the emitter terminal 712. The biasing conditions between the emitter and base terminals 712 and 710, and the base and collector terminals 710 and 708 also cause holes to be injected from the base terminal 710 to the emitter terminal 712, which contributes to the current flowing into the base terminal 710 as well as the current flowing out of the emitter terminal 712. It will be apparent to a person skilled in the art that the BICFET VCSEL 700 may also be configured to function as an n-channel BICFET. As the second through fifth VCSELs 204a-204c, and 206 are structurally and functionally similar to the first VCSEL 202, thus the second through fifth VCSELs 204a-204c, and 206 may also operate as the BICFET VCSEL 700.

In an embodiment, the drain terminal 410 of the transistor 104 is connected to the emitter terminal 712 of the BICFET VCSEL 700. The drain terminal 410 of the transistor 104 outputs the control current I_CTRL to the emitter terminal 712 of the BICFET VCSEL 700. The BICFET VCSEL 700 receives the control current I_CTRL and generates the optical signal at the first wavelength. The second oxide isolation layer 704 directs the optical signal in the resonant cavity and reduces the loss of optical signal from escaping through the sidewalls of the BICFET VCSEL 700. The optical signal is then incident on the REIs incorporated in the third top DBR mirror 706. The REIs perform photon up-conversion of the optical signal at the first wavelength to emit the optical signal at the second wavelength, i.e., visible light. The visible light includes at least one of red, blue, and green lights corresponding to the $Er^{3+}$, $Tm^{3+}$, and $Yb^{3+}$ ions. In one embodiment, the third top DBR mirror 706 is incorporated with one of the $Er^{3+}$, $Tm^{3+}$, and $Ym^{3+}$ ions. Hence, the BICFET VCSEL 700 emits one of the red, blue, and green lights corresponding to the $Er^{3+}$, $Tm^{3+}$, and $Ym^{3+}$ ions, respectively. In another embodiment, when the fifth VCSEL 206 functions as the BICFET VCSEL 700, the third top DBR mirror 706 is divided into the tenth through twelfth pie-shaped sections. In one example, the tenth pie-shaped section is incorporated with $Er^{3+}$ ions. Hence, the tenth pie-shaped section emits red light. The eleventh pie-shaped section is incorporated with $Tm^{3+}$ ions. Hence, the eleventh pie-shaped section emits blue light. The twelfth pie-shaped section is incorporated with $Ym^{3+}$ ions. Hence, the twelfth pie-shaped section emits green light. In yet another embodiment, the REIs perform photon down-conversion of the optical signal at the first wavelength to emit the optical signal at the second wavelength. Thus, the optical signal at the first wavelength is at a lower wavelength than the optical signal at the second wavelength. In yet another embodiment, the REIs are incorporated in the bottom DBR mirror layer 304 to emit the optical signal at the second wavelength. Since the substrate 302 is made from GaAs and is transparent, the BICFET VCSEL 700 emits the optical signal at the second wavelength through the substrate 302. It will be apparent to a person skilled in the art that the bottom DBR mirror layer 304 performs photon up-conversion or down-conversion in manner similar to the third top DBR mirror 706 as described in the aforementioned specification. In yet another embodiment, the REIs are incorporated in both the third top DBR mirror and bottom DBR mirror layer 706 and 304.

The thicknesses of the first, second, and third top DBR mirrors 510, 608, and 706 determine the optical path lengths for the infrared light. The first, second, and third top DBR mirrors 510, 608, and 706 in conjunction with the REIs determine the second wavelength emitted by the optical emitter 106. It will be apparent to a person skilled in the art that the bottom DBR mirror layer 304 in conjunction with the REIs determines the second wavelength of the optical signal when the optical signal is emitted from the bottom DBR mirror layer 304.

The REIs are incorporated into at least one of the first, second, and third top DBR mirrors 510, 608, and 706, the top DBR mirror layer 324, and the bottom DBR mirror layer 304 instead of the active region of the first VCSEL 202. Incorporating the REIs into the first, second, and third top DBR mirrors 510, 608, and 706, the top DBR mirror layer 324, and the bottom DBR mirror layer 304 allows for the optical signal to be reflected multiple times due to the REIs deposited therein. Since the optical signal is reflected multiple times in the first, second, and third top DBR mirrors 510, 608, and 706, the top DBR mirror layer 324, and the bottom DBR mirror layer 304, the intensity of the optical signal emitted by the optical emitter 106 increases, thus facilitating a higher pumping efficiency of the first through fifth VCSELs 202, 204a-204c, and 206. A higher pumping efficiency of the first through fifth VCSELs 202, 204a-204c, and 206 prevents high optical loss through the second epitaxial layer structure 300b thereof. Further, the higher pumping efficiency enables high power efficiency of the light emitting device 100 due to which the light emitting device 100 consumes low power. Further, the transistor 104 and the optical emitter 106 are formed on the substrate 302 and do not require multiple substrates as is often the case with commercially available, off-the-shelf LCDs. Multiple types of the REIs such as $Er^{3+}$, $Tm^{3+}$, $Ce^{3+}$, $Yb^{3+}$, and $Tb^{4+}$ facilitate emission and absorption of lights of multiple wavelengths through the first VCSEL 202. This eliminates the need for having a separate VCSEL for each wavelength. Hence, the light emitting device 100 is less bulky. Further, each of the first through ninth pixels 102a-102i includes a corresponding HEMT for controlling the corresponding optical signal. Each of the HEMTs corresponding to the first through ninth pixels 102a-102i generates a corresponding control current. Thus, each of the first through ninth pixels 102a-102i is controlled by a corresponding HEMT. Since, each of the first through ninth pixels 102a-102i is controlled individually, the light emitting device 100 may be employed as a smart pixel array.

The foregoing disclosure of the exemplary embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

The invention claimed is:

1. A device comprising:
a light emitting device disposed between first and second distributed Bragg reflector (DBR) mirrors,
wherein at least one of the first and second DBR mirrors comprises a plurality of rare earth elements incorporated therein,
wherein the plurality of rare earth elements comprises semiconductor nanoparticles.

2. The device of claim 1,
wherein the first and second DBR mirrors each comprise the plurality of rare earth elements.

3. The device of claim 1,
wherein the at least one of the first and second DBR mirrors comprises a stack of layers having different refractive indexes, and
wherein at least one or more layers of the stack of layers comprises the plurality of rare earth elements.

4. The device of claim 1,
wherein the incorporation of the plurality of rare earth elements into the at least one of the first and second DBR mirrors is configured so that the at least one of the first and second DBR mirrors, upon exposure to a first optical signal emitted from the light emitting device, provides a second optical signal at a longer wavelength than a wavelength of the first optical signal.

5. The device of claim 1,
wherein the incorporation of the plurality of rare earth elements into the at least one of the first and second DBR mirrors is configured so that the at least one of the first and second DBR mirrors, upon exposure to a first optical signal emitted from the light emitting device, provides a second optical signal at a shorter wavelength than a wavelength of the first optical signal.

6. A device comprising:
a first distributed Bragg reflector (DBR) mirror disposed on a substrate;
a layer structure disposed on the first DBR mirror,
wherein the layer structure is configured to emit a first optical signal at a first wavelength; and
a second DBR mirror disposed on the layer structure,
wherein at least one of the first and second DBR mirrors comprises a plurality of elements incorporated therein, and
wherein the incorporation of the plurality of elements into the at least one of the first and second DBR mirrors is configured so that the at least one of the first and second DBR mirrors, upon exposure to the first optical signal, provides a second optical signal at a second wavelength different from the first wavelength, and
wherein the plurality of elements comprises rare earth elements, and
wherein the plurality of elements comprises semiconductor nanoparticles.

7. The device of claim 6,
wherein the at least one of the first and second DBR mirrors comprises the first DBR mirror.

8. The device of claim 6,
wherein the at least one of the first and second DBR mirrors comprises the first and second DBR mirrors.

9. The device of claim 6,
wherein the at least one of the first and second DBR mirrors comprises a stack of repeated layers having different refractive indexes, and
wherein at least one or more layers of the repeated layers comprise the plurality of elements.

10. The device of claim 6,
wherein the at least one of the first and second DBR mirrors comprises a stack of repeated layers having different refractive indexes, and
wherein at least one or more alternate layers of the repeated layers comprise the plurality of elements.

11. The device of claim 6,
wherein the device is configured to form a part of at least one of a thyristor vertical cavity surface emitting laser, an asymmetric thyristor vertical cavity surface emitting laser, or a bipolar inversion channel field effect transistor vertical cavity surface emitting laser.

12. The light emitting device of claim 11, wherein the at least one of the first and second DBR mirrors comprises the first DBR mirror, the second DBR mirror, or the first and second DBR mirrors.

13. The light emitting device of claim 11, wherein the at least one of the first and second DBR mirrors is configured to perform up-conversion or down-conversion on the first optical signal.

14. The light emitting device of claim 11, wherein the at least one of the first and second DBR mirrors comprises a stack of layers having different refractive indexes, and
wherein at least one or more layers of the stack of layers comprise the plurality of rare earth elements.

15. The light emitting device of claim 11, wherein the at least one of the first and second DBR mirrors comprises a stack of layers having different refractive indexes, and
wherein at least one or more alternate layers of the stack of layers comprise the plurality of rare earth elements.

16. The light emitting device of claim 11, wherein the layer structure comprises a second transistor configured to emit the first optical signal, and
wherein the first and second transistors comprise a similar structure.

17. The device of claim 6, further comprising a transistor disposed on the substrate,
wherein the device is coupled to the transistor for receiving a current to drive or to control the device.

18. A light emitting device, comprising:
an array of pixels formed on a substrate,
wherein each pixel of the array of pixels includes a first transistor and at least one optical emitter, and
wherein the at least one optical emitter comprises:
a first distributed Bragg reflector (DBR) mirror disposed on the substrate; and
a layer structure disposed on the first DBR mirror,
wherein the layer structure is configured to emit a first optical signal at a first wavelength; and
a second DBR mirror disposed on the layer structure,
wherein at least one of the first and second DBR mirrors comprises a plurality of rare earth elements configured to, upon exposure to the first optical signal, provide a second optical signal at a second wavelength that is different from the first wavelength; and
wherein the plurality of rare earth elements comprises semiconductor nanoparticles.

* * * * *